United States Patent
Ogawa

(10) Patent No.: US 9,685,888 B2
(45) Date of Patent: Jun. 20, 2017

(54) SEMICONDUCTOR MODULE, UPPER AND LOWER ARM KIT, AND THREE-LEVEL INVERTER

(75) Inventor: Shogo Ogawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 411 days.

(21) Appl. No.: 14/124,871

(22) PCT Filed: Jun. 6, 2012

(86) PCT No.: PCT/JP2012/064544
§ 371 (c)(1),
(2), (4) Date: Feb. 14, 2014

(87) PCT Pub. No.: WO2012/169521
PCT Pub. Date: Dec. 13, 2012

(65) Prior Publication Data
US 2014/0169054 A1    Jun. 19, 2014

(30) Foreign Application Priority Data

Jun. 10, 2011  (JP) .................................. 2011-129923

(51) Int. Cl.
| | |
|---|---|
| H02M 7/5387 | (2007.01) |
| H01L 25/18 | (2006.01) |
| H02M 7/00 | (2006.01) |
| H02M 7/487 | (2007.01) |
| H03K 17/56 | (2006.01) |
| H01L 25/07 | (2006.01) |

(52) U.S. Cl.
CPC .......... *H02M 7/5387* (2013.01); *H01L 25/18* (2013.01); *H02M 7/003* (2013.01); *H02M 7/487* (2013.01);
(Continued)

(58) Field of Classification Search
CPC .... H02M 7/003; H02M 7/487; H02M 7/5387; H02M 7/44; H02M 7/49; H02M 7/538;
(Continued)

(56) References Cited

U.S. PATENT DOCUMENTS 5,926,381 A * 7/1999 Moriguchi .............. H02M 7/25
                                                        363/132
5,953,222 A   9/1999 Mizutani
(Continued)

FOREIGN PATENT DOCUMENTS

| JP | H03-65065 A | 3/1991 |
|---|---|---|
| JP | H03-108749 A | 5/1991 |

(Continued)

*Primary Examiner* — Emily P Pham
*Assistant Examiner* — Shahzeb K Ahmad
(74) *Attorney, Agent, or Firm* — Rabin & Berdo, P.C.

(57) ABSTRACT

A semiconductor module, an upper and lower arm kit, and a three-level inverter can be provided at low cost and with broad current ratings and voltage ratings using existing packages, without developing new packages. A first semiconductor module (100) on an upper arm side and a second semiconductor module (200) on a lower arm side are made using an existing package, and the semiconductor modules (100) and (200) are used to configure an upper and lower arm kit (300). Further, the upper and lower arm kit (300) is used to configure a three-level inverter (500). These devices can be formed using existing packages (56), and semiconductor modules (100), (200), the upper and lower arm kit (300), and the three-level inverter (500) can be therefore provided at low cost and with broad current ratings and voltage ratings.

4 Claims, 24 Drawing Sheets

(52) U.S. Cl.
CPC ............ H03K 17/56 (2013.01); *H01L 25/072* (2013.01); *H01L 2224/0603* (2013.01); *H01L 2224/48139* (2013.01); *H01L 2224/49111* (2013.01); *H01L 2924/1305* (2013.01); *H01L 2924/13055* (2013.01); *H01L 2924/13091* (2013.01); *H01L 2924/19107* (2013.01)

(58) Field of Classification Search
CPC ...... H02M 7/53871; H01L 2224/49111; H02L 25/072; H02L 2924/1305; H02L 2924/13055; H02L 2924/13091; H02L 2924/19107; H03K 17/56
USPC ........................................ 363/132, 144, 147
See application file for complete search history.

(56) References Cited

U.S. PATENT DOCUMENTS

| | | | | |
|---|---|---|---|---|
| 7,639,515 B2 * | 12/2009 | Ponnaluri | ............. | H02M 7/487 363/131 |
| 8,716,986 B2 * | 5/2014 | Tabata | .................. | H02M 7/538 323/222 |
| 2009/0244936 A1 * | 10/2009 | Falk | ....................... | H02M 7/487 363/40 |
| 2010/0039843 A1 | 2/2010 | Takizawa | | |
| 2011/0116293 A1 * | 5/2011 | Tabata | .................. | H02M 7/487 363/132 |

FOREIGN PATENT DOCUMENTS

| | | | |
|---|---|---|---|
| JP | H09-9644 | A | 1/1997 |
| JP | H10-14260 | A | 1/1998 |
| JP | 2002-247862 | A | 8/2002 |
| JP | 2008-193779 | A | 8/2008 |
| JP | 2010-016947 | A | 1/2010 |
| JP | 2010-288415 | A | 12/2010 |
| JP | 2011-030350 | A | 2/2011 |
| WO | WO2010146637 | * | 12/2010 |
| WO | WO2010150549 | * | 12/2010 |

* cited by examiner

SEMICONDUCTOR MODULE, UPPER AND LOWER ARM KIT, AND THREE-LEVEL INVERTER

TECHNICAL FIELD

This invention relates to a semiconductor module, an upper and lower arm kit formed of the semiconductor module, and a three-level inverter formed of the upper and lower arm kit.

BACKGROUND ART

FIG. 13 is a circuit diagram of a three-level inverter of the prior art, which converts direct current into alternating current.

In FIG. 13, the drawing symbols 51 and 52 denote DC power supplies connected in series, the positive and negative electrode potentials are denoted by P and N respectively, and the neutral point potential is denoted by M. When the DC power supplies 51 and 52 are configured from an AC power supply system, the configuration can use diode rectifiers, large-capacitance electrolytic capacitors and similar which are not shown.

Between the positive electrode potential P and the negative electrode potential N are connected series-connected circuits, of insulated-gate bipolar transistors (hereafter "IGBTs") with antiparallel-connected diodes, for three phases. That is, a series-connected circuit 60 for a U phase is a series-connected circuit of an upper arm formed of an IGBT (T1) with an antiparallel-connected diode D1, and a lower arm formed of a IGBT (T2) with an antiparallel-connected diode D2; a series-connected circuit 61 for a V phase is a series-connected circuit of an upper arm formed of an IGBT (T3) with an antiparallel-connected diode D3, and a lower arm formed of a IGBT (T4) with an antiparallel-connected diode D4; and a series-connected circuit 62 for a W phase is a series-connected circuit of an upper arm formed of an IGBT (T5) with an antiparallel-connected diode D5, and a lower arm formed of a IGBT (T6) with an antiparallel-connected diode D6.

Between the series connection point of the upper arm and lower arm and the DC neutral point potential M of the series-connected circuit for each phase is connected an AC switch in which is an antiseries-connected IGBT with an antiparallel-connected diode. That is, an AC switch, configured with the emitter of an IGBT module 63 formed of an IGBT 81 with an antiparallel-connected diode 82 connected to the emitter of an IGBT module 64 formed of an IGBT 83 with an antiparallel-connected diode 84, is connected between the series connection point and the DC power supply neutral point M of the series-connected circuit 60 for the U phase; an AC switch, configured with the emitter of an IGBT module 65 formed of an IGBT 85 with an antiparallel-connected diode 86 connected to the emitter of an IGBT module 66 formed of an IGBT 87 with an antiparallel-connected diode 88, is connected between the series connection point and the DC power supply neutral point M of the series-connected circuit 61 for the V phase; and, an AC switch, configured with the emitter of an IGBT module 67 formed of an IGBT 89 with an antiparallel-connected diode 90 connected to the emitter of an IGBT module 68 formed of an IGBT 91 with an antiparallel-connected diode 92, is connected between the series connection point and the DC power supply neutral point M of the series-connected circuit 62 for the W phase. The output of the series connection point of each of the series-connected circuits 60, 61, 62 is an AC output, and is connected to the load 74 via respective filtering inductors 71, 72, 73.

By using this circuit configuration, the series connection points of each of the series-connected circuits 60, 61, 62 can output the positive electrode potential P, negative electrode potential N, and neutral point potential M, for three-level inverter output. FIG. 14 shows an example of an output voltage (Vout) waveform. A feature compared with a two-level type inverter is the output of an AC voltage having three voltage levels with few lower-order harmonic components, so that the filtering inductors (output filters) 71 to 73 can be miniaturized.

Next, the three-level inverter of the prior art described in Patent Document 1 is explained using FIG. 15.

FIG. 15 is a diagram of the configuration of upper and lower arms for one phase, including an AC switch, of a three-level inverter; here FIG. 15(a) is a circuit diagram, and FIG. 15(b) is a perspective view of the semiconductor module.

The semiconductor module 40 shown in FIG. 15(b) accommodates an AC switch 53, in which two reverse blocking IGBTs 54 and 55 are antiparallel-connected, as shown in FIG. 15(a), and two IGBTs (T1 and T2).

FIG. 16 is a schematic cross-sectional view of the semiconductor module. In the semiconductor module 40, power semiconductor chips 43 (denoted by the symbols T1, T2, D1, D2, 54 and 55 in FIG. 15) are mounted on an insulating substrate 42 on a heat-dissipating metal base 41, metal terminals 44 leading to outside are exposed on the upper face of the package 45, and the interior of the package 45 is packed with resin 46.

This semiconductor module 40 is applied to a voltage-type three-level inverter. The semiconductor module 40 is formed of the first IGBT (T1) having a collector terminal C1 connected to the positive electrode terminal (P terminal) of the series-connected circuit 60 and having the diode D1 antiparallel-connected thereto, and the second IGBT (T2) having a collector connected to the emitter of the first IGBT (T1), an emitter terminal E2 connected to the negative electrode terminal (N terminal) of the series-connected circuit 60, and the diode D2 antiparallel-connected thereto.

The semiconductor module 40 is also formed of the AC switch 53, configured using the first reverse blocking IGBT 54 the collector of which is connected to the emitter of the first IGBT (T1) and the second reverse blocking IGBT 55 antiparallel-connected to the first reverse blocking IGBT 54.

The series-connected circuit 60 is configured using the first IGBT (T1) with the antiparallel-connected diode D1 and the second IGBT (T2), the positive electrode terminal (P terminal) of the series-connected circuit 60 is connected to the collector terminal C1 of the first IGBT, and the negative electrode terminal (N terminal) is connected to the emitter terminal E2 of the second IGBT (T2).

The AC switch 53 is configured using the first reverse blocking IGBT 54 and the second reverse blocking IGBT 55.

Further, the AC switch 53 is connected between the connection point E1C2 of the emitter of the first IGBT (T1) and the collector of the second IGBT (T2), and the intermediate potential terminal (M terminal) at an intermediate potential between the positive electrode terminal (P terminal) and negative electrode terminal (N terminal) of the series-connected circuit 60. The first IGBT (T1), second IGBT (T2), first reverse blocking IGBT 54 and second reverse blocking IGBT 55 are accommodated in a single package 45.

In this way, one upper and lower arm is accommodated in one package 45, and when three of these packages 45 are used to configure a three-level inverter, external wiring is simplified. Further, the wiring inductance of the three-level inverter can be reduced, and the device as a whole can be miniaturized.

Here, a reverse blocking IGBT is an IGBT having a reverse-direction breakdown voltage (reverse breakdown voltage) equal to the forward-direction breakdown voltage (forward breakdown voltage), and because the forward breakdown voltage and reverse breakdown voltage are equal, the device is sometimes called a symmetrical IGBT.

Further, an IGBT not having a reverse breakdown voltage refers to what is called an asymmetrical IGBT, the reverse breakdown voltage of which is much lower than the forward breakdown voltage. In an inverter circuit in which a reverse breakdown voltage is not applied, for example such an IGBT, the device is frequently used with an antiparallel-connected freewheeling diode. Normally, "IGBT" simply means an IGBT without a reverse breakdown voltage.

Further, Patent Documents 2 to 4 disclose so-called single units of a semiconductor module, in which two types of modules are prepared with the lead positions of the emitter terminals and collector terminals swapped, the two module types disposed in a row, and by connecting the emitter terminal of one module to the collector terminal of the other adjacent module, one upper and lower arm of an inverter are configured.

Patent Document 1: Japanese Patent Application Laid-open No. 2008-193779
Patent Document 2: Japanese Patent Application Laid-open No. H3-108749
Patent Document 3: Japanese Patent Application Laid-open No. H3-65065
Patent Document 4: Japanese Patent Application Laid-open No. H9-9644

However, when manufacturing a three-level inverter using the semiconductor module shown in FIG. 15, depending on the capacity of the three-level inverter, the IGBTs, reverse blocking IGBTs and other semiconductor elements incorporated within the module are changed. That is, in order to increase the capacity, the semiconductor element chip size may be changed, or parallel connections of IGBTs and reverse blocking IGBTs may be made. Thus when preparing three-level inverters with various capacities, dedicated semiconductor module packages 45 must be newly developed according to the IGBTs, reverse blocking IGBTs, and other semiconductor elements incorporated. Consequently in order to support a broad range of currents from tens of amperes to thousands of amperes, a number of packages must be newly prepared. Moreover, in order to support a broad range of breakdown voltages from hundreds of volts to over a thousand volts, a number of packages must be newly prepared.

There are also cases in which the first and second IGBTs (T1 and T2) and the first and second reverse blocking IGBTs 54 and 55 are used in separate packages 56a and 57 (see FIG. 17 and FIG. 19) to configure a three-level inverter.

FIG. 17 shows the configuration of inverter upper and lower arms for one phase; FIG. 17(a) is a circuit diagram, and FIG. 17(b) is a plane view of principal components of the semiconductor module. In the example shown, the three main terminals (E1C2, E2 and C1) are disposed in one row on the upper face of the package 56a.

FIG. 18 is a diagram of the inner structure of the semiconductor module of FIG. 17. The E1C2 terminals at a and b are connected within the package 56a, and what is disposed above the package 56a is E1C2 a.

FIG. 19 shows the configuration of an AC switch in which reverse blocking IGBTs are antiparallel-connected. FIG. 19(a) is a circuit diagram, and FIG. 19(b) is a plane view of the AC switch package.

The three-level inverter shown in FIG. 15 is configured combining semiconductor modules 47 of first and second IGBTs (T1 and T2) upper and lower arms (series-connected circuit 60) shown in FIG. 17 and FIG. 18, and AC switches 53 shown in FIG. 19 using first and second reverse blocking IGBTs 54 and 55. In this case, the package of a semiconductor module 47 shown in FIG. 17 is an existing package 56a, and is a normally used two-unit package accommodating an upper arm element and a lower arm element. On this existing package 56a are disposed the three main terminals (E1C2, C1 and E2).

However, the package 57 of the AC switch 53 shown in FIG. 19(b) differs from the internal wiring circuit configuration of the semiconductor module 47 shown in FIG. 17 and FIG. 18 in that there are two main terminals (the K terminal and L terminal), and so the package 56a of FIG. 17(b) cannot be used.

For this reason, a package 57 accommodating the first and second reverse blocking IGBTs 54 and 55 must be newly developed according to the current rating and voltage rating.

When manufacturing a three-level inverter, a new package must be developed both in cases where the semiconductor module 40 of FIG. 15 (new package 45) is used, and in cases where the semiconductor module 47 of FIG. 17 (existing package 56a) and the AC switch 53 of FIG. 19 (new package 57) are combined and used.

Further, Patent Documents 2 to 4 do not indicate that by changing semiconductor elements disposed in the interior using existing packages with external terminals in the same positions, two types of modules with the same package shape are formed, and the two types of modules are used to configure one upper and lower arm of a three-level inverter.

DISCLOSURE OF THE INVENTION

An object of this invention is to resolve the above problems to provide a semiconductor module, an upper and lower arm kit and a three-level inverter with low cost and broad current ratings and voltage ratings using existing packages, without developing new packages.

In order to attain the above object, a semiconductor module is provided as follows. A semiconductor module has a first switching element not having a reverse breakdown voltage, and antiparallel-connected to a freewheeling diode; a first reverse blocking switching element having a reverse breakdown voltage, and series-connected to the first switching element; a first package, in which the first switching element and the first reverse blocking switching element are accommodated; a high-potential side terminal (C11), disposed on an upper face of the first package and connected to the high-potential side of the first switching element; a first intermediate potential auxiliary terminal (M11), disposed on the upper face of the first package and connected to the low-potential side of the first reverse blocking switching element; and a first connection terminal (Q11), disposed on the upper face of the first package and connected to the first switching element and to the first reverse blocking switching element.

Further, the semiconductor module is provided as follows. The first switching element is an insulated-gate bipolar transistor not having a reverse breakdown voltage, and the first reverse blocking switching element is a reverse blocking insulated-gate bipolar transistor having a reverse breakdown voltage, the collector of which is the high-potential side and the emitter of which is the low-potential side.

Further, in order to attain the above object, a semiconductor module is provided as follows. The semiconductor module has a second reverse blocking switching element having a reverse breakdown voltage; a second switching element not having a reverse breakdown voltage, series-connected to the second reverse blocking switching element and antiparallel-connected to a freewheeling diode; a second package, in which the second reverse blocking switching element and the second switching element are accommodated; a second intermediate potential auxiliary terminal (M22), disposed on an upper face of the second package and connected to the high-potential side of the second reverse blocking switching element; a low-potential side terminal (E22), disposed on the upper face of the second package and connected to the low-potential side of the second switching element; and a second connection terminal (Q22), disposed on the upper face of the second package, and connected to the second reverse blocking switching element and to the second switching element.

Further, the semiconductor module is provided as follows. The second switching element is an insulated-gate bipolar transistor not having a reverse breakdown voltage, and the second reverse blocking switching element is a reverse blocking insulated-gate bipolar transistor having a reverse breakdown voltage, the collector of which is the high-potential side, and the emitter of which is the low-potential side.

Further, in order to attain the above object, an upper and lower arm kit is provided as follows. The upper and lower arm kit is formed of a pair of a first semiconductor module to be an upper arm and a second semiconductor module to be a lower arm in a three-level inverter. The first semiconductor module has a first switching element not having a reverse breakdown voltage, and antiparallel-connected to a freewheeling diode; a first reverse blocking switching element having a reverse breakdown voltage, and series-connected to the first switching element; a first package, in which the first switching element and the first reverse blocking switching element are accommodated; a high-potential side terminal (C11), disposed on an upper face of the first package and connected to the high-potential side of the first switching element; a first intermediate potential auxiliary terminal (M11), disposed on the upper face of the first package and connected to the low-potential side of the first reverse blocking switching element; and a first connection terminal (Q11), disposed on the upper face of the first package and connected to the first switching element and to the first reverse blocking switching element. The second semiconductor module has a second reverse blocking switching element having a reverse breakdown voltage; a second switching element not having a reverse breakdown voltage, series-connected to the second reverse blocking switching element and antiparallel-connected to a freewheeling diode; a second package, in which the second reverse blocking switching element and the second switching element are accommodated; a second intermediate potential auxiliary terminal (M22), disposed on an upper face of the second package and connected to the high-potential side of the second reverse blocking switching element; a low-potential side terminal (E22), disposed on the upper face of the second package and connected to the low-potential side of the second switching element; and a second connection terminal (Q22), disposed on the upper face of the second package, and connected to the second reverse blocking switching element and to the second switching element.

Further, a three-level inverter in which three of the upper and lower arm kits are disposed in parallel is provided. In the three-level inverter, the high-potential side terminals (C11 terminals) of the first semiconductor modules are connected together by a third connection conductor; the low-potential side terminals (E22 terminals) of the second semiconductor modules are connected together by a fourth connection conductor; the intermediate potential auxiliary terminal (M11) of each of the first semiconductor modules and the intermediate potential auxiliary terminal (M22) of each of the second semiconductor modules are connected together by a fifth connection conductor; the third connection conductor and the fifth connection conductor are respectively connected to a positive electrode and a negative electrode of a first DC power supply; the fifth connection conductor and the fourth connection conductor are respectively connected to a positive electrode and a negative electrode of a second DC power supply; the first connection terminal (Q11) of each of the first semiconductor modules and the second connection terminal (Q22) of each of the second semiconductor modules are connected together by a sixth connection conductor; and the three sixth connection conductors are taken to be output terminals which are the U terminal, the V terminal, and the W terminal.

Further, in order to attain the above object, an upper and lower arm kit is provided as follows. The upper and lower arm kit includes a first semiconductor module and a second semiconductor module. The first semiconductor module has a first switching element not having a reverse breakdown voltage, and antiparallel-connected to a freewheeling diode; a first reverse blocking switching element having a reverse breakdown voltage, and series-connected to the first switching element; a first package, in which the first switching element and the first reverse blocking switching element are accommodated; a high-potential side terminal (C11), disposed on an upper face of the first package and connected to the high-potential side of the first switching element; a first intermediate potential auxiliary terminal (M11), disposed on the upper face of the first package and connected to the low-potential side of the first reverse blocking switching element; and a first connection terminal (Q11), disposed on the upper face of the first package and connected to the first switching element and to the first reverse blocking switching element. The second semiconductor module has a second reverse blocking switching element having a reverse breakdown voltage; a second switching element not having a reverse breakdown voltage, series-connected to the second reverse blocking switching element and antiparallel-connected to a freewheeling diode; a second package, in which the second reverse blocking switching element and the second switching element are accommodated; a second intermediate potential auxiliary terminal (M22), disposed on an upper face of the second package and connected to the high-potential side of the second reverse blocking switching element; a low-potential side terminal (E22), disposed on the upper face of the second package and connected to the low-potential side of the second switching element; and a second connection terminal (Q22), disposed on the upper face of the second package, and connected to the second reverse blocking switching element and to the second switching element. The first connection terminal (Q11 terminal) and second connection terminal (Q22 terminal) are connected by a first connection conductor, and the intermediate potential auxiliary terminal (M11 terminal) of the first semiconductor module and the intermediate potential auxiliary terminal (M22 terminal) of the second semiconductor module are connected by a second connection conductor.

Further, a three-level inverter in which three of the upper and lower arm kits are disposed in parallel is provided. In the three-level inverter, the output terminals of the three-level inverter which are the U terminal, the V terminal, and the W terminal, are connected to the three first connection conductors, respectively; the second connection conductors are connected together as an intermediate potential terminal (M terminal); the high-potential side terminals of the first semiconductor modules are connected together and to the positive electrode of a first DC power supply via a third connection conductor (P terminal); the negative electrode of the first DC power supply is connected to the intermediate potential terminal (M terminal); the low-potential side terminals of the second semiconductor modules are connected together and to the negative electrode of a second DC power supply via a fourth connection conductor (N terminal); and the positive electrode of the second DC power supply is connected to the intermediate potential terminal (M terminal).

By means of this invention, existing packages (with three main terminals) can be used to configure a semiconductor module, an upper and lower arm kit, and a three-level inverter, so that design efficiency can be improved and package members can be used in common without the need to develop new packages, and consequently costs can be lowered.

Further, various existing packages can be used to configure circuits, so that semiconductor modules, upper and lower arm kits, and three-level inverts with broad ranges of current ratings and voltage ratings can be provided.

The above and other objects, features and advantages of the invention will become clear through the following explanations in relation to the attached drawings which show preferred embodiments as examples of the invention.

BRIEF DESCRIPTION OF THE DRAWINGS

FIG. 1 is a diagram of the configuration of the semiconductor module of a first example of the invention, in which

FIG. 3 is a diagram of the configuration of the semiconductor module of a second example of the invention, in which

FIG. 15 is a diagram of the configuration of an upper and lower arm for one phase, including an AC switch of a three-level inverter, in which

FIG. 17 shows the configuration of inverter upper and lower arms for one phase, in which

FIG. 19 shows the configuration of an AC switch in which reverse blocking IGBTs are antiparallel-connected, in which

BEST MODE FOR CARRYING OUT THE INVENTION

Embodiments are explained using the following examples.

EXAMPLE 1

Figure 1A:
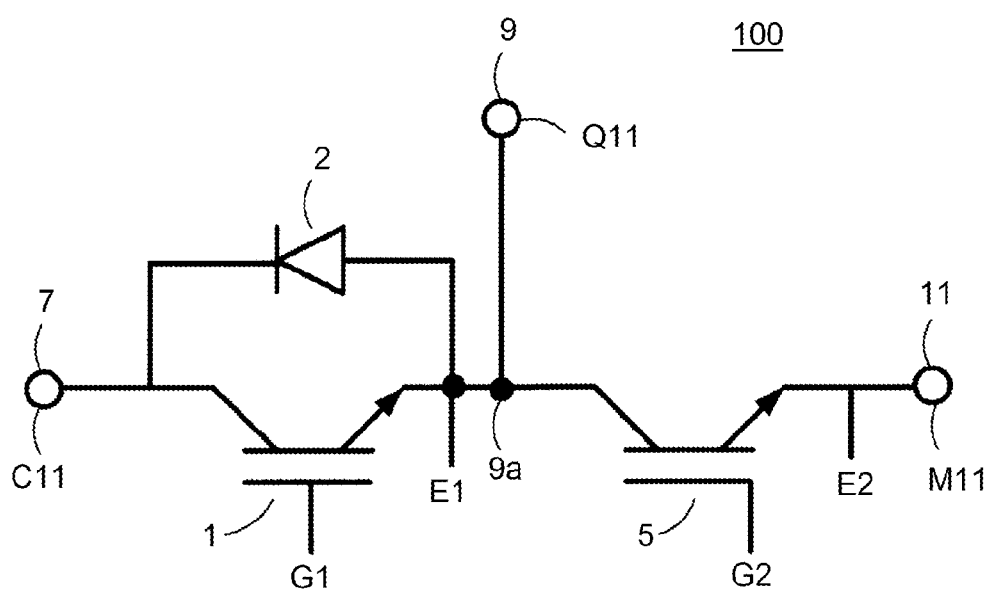
FIG. 1(a) is a circuit diagram of principal components and FIG. 1(b) is a plane view of principal components.
Figure 1B:
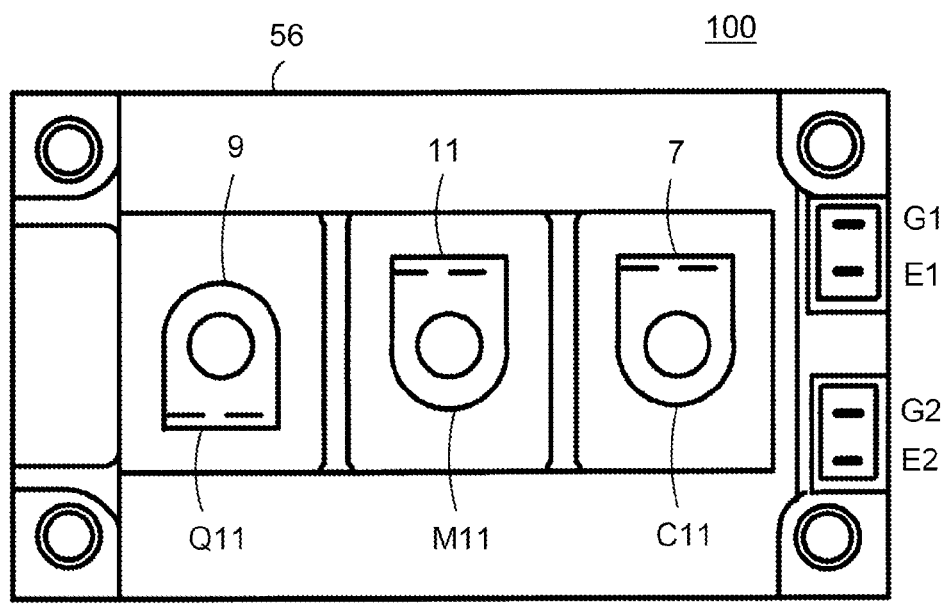
Figure 2:
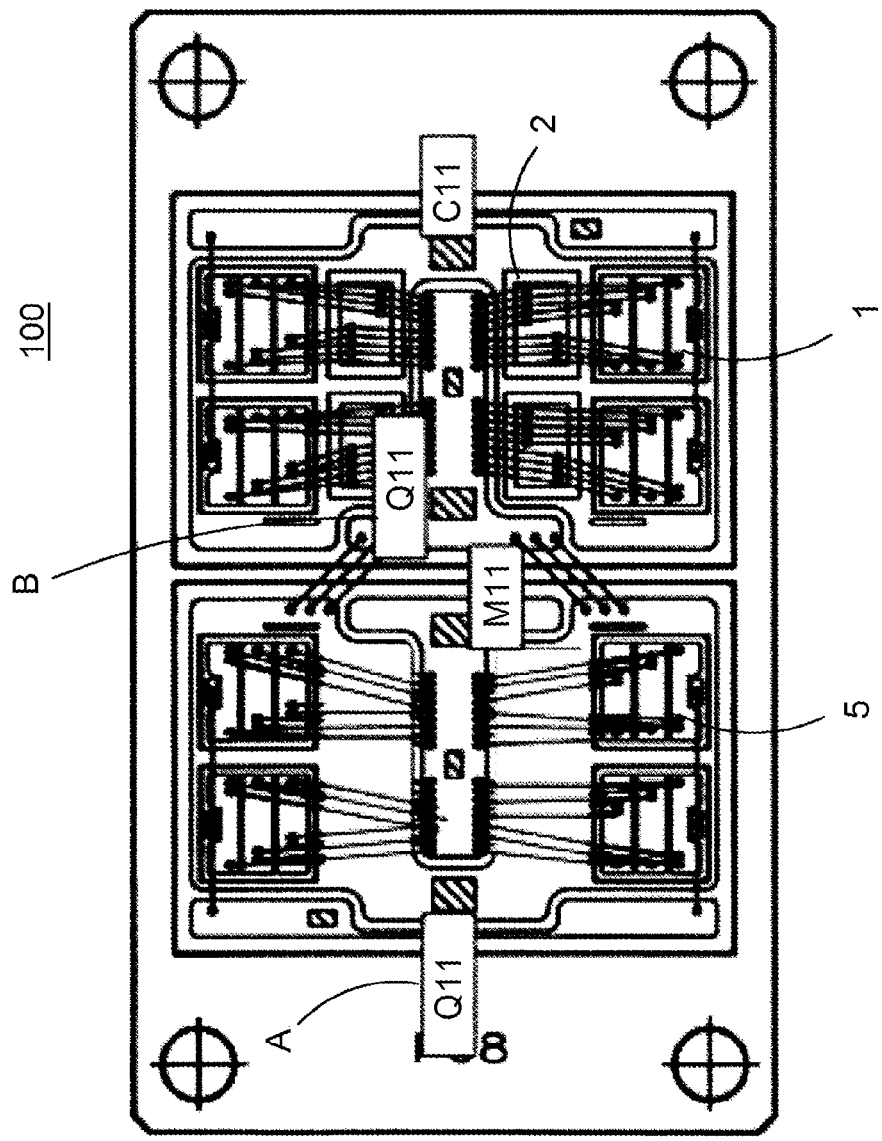
FIG. 2 is a diagram of the internal configuration of the semiconductor module of FIG. 1.

FIG. 1 is a diagram of the configuration of the semiconductor module of a first example of the invention, in which FIG. 1(a) is a circuit diagram of principal components and FIG. 1(b) is a plane view of principal components. FIG. 2 is a diagram of the internal configuration of the semiconductor module of FIG. 1. In FIG. 2 an example is shown in which four first reverse blocking IGBTs 5, having a reverse breakdown voltage, are parallel-connected, four first IGBTs 1 (normally used IGBTs), not having a reverse breakdown voltage, are connected in parallel, and four FWDs (freewheeling diodes)2 are antiparallel-connected to each of the first IGBTs 1. This is the same as the case in which the FWDs (D2) in FIG. 18 are eliminated. The Q11 terminals a and b are connected within the package 56, and the Q11 terminal a is disposed on the package 56, corresponding to the terminal E1C2 in FIG. 17.

A feature of this first semiconductor module 100 is that the first IGBT 1 not having a reverse breakdown voltage and antiparallel-connected to the FWD 2 of the upper arm of a series-connected circuit of the three-level inverter, and the first reverse blocking IGBT 5 having a reverse breakdown voltage of the AC switch, are accommodated in the same package 56 as an existing package 56a.

In the configuration of FIG. 1, the first semiconductor module 100 is configured with the first IGBT 1, with an antiparallel-connected FWD 2, series-connected to the first reverse blocking IGBT 5, and the emitter of the first IGBT 1 and collector of the first reverse blocking IGBT 5 connected by the connection point 9*a*.

On the package 56 are disposed the high-potential side terminal 7 (C11), connected to the collector of the first IGBT 1, the first intermediate potential auxiliary terminal 11 (M11), connected to the emitter of the first reverse blocking IGBT 5, and the first connection terminal 9 (Q11), connected to the connection point 9*a* of the emitter of the first IGBT 1 and the collector of the first reverse blocking IGBT 5.

Further, on the package 56 are disposed the gate terminals G1 and G2 and auxiliary emitter terminals E1 and E2 of the first IGBT 1 and the first reverse blocking IGBT 5 respectively. Q11 described above is a terminal corresponding to E1C2 in FIG. 17.

Figure 9:
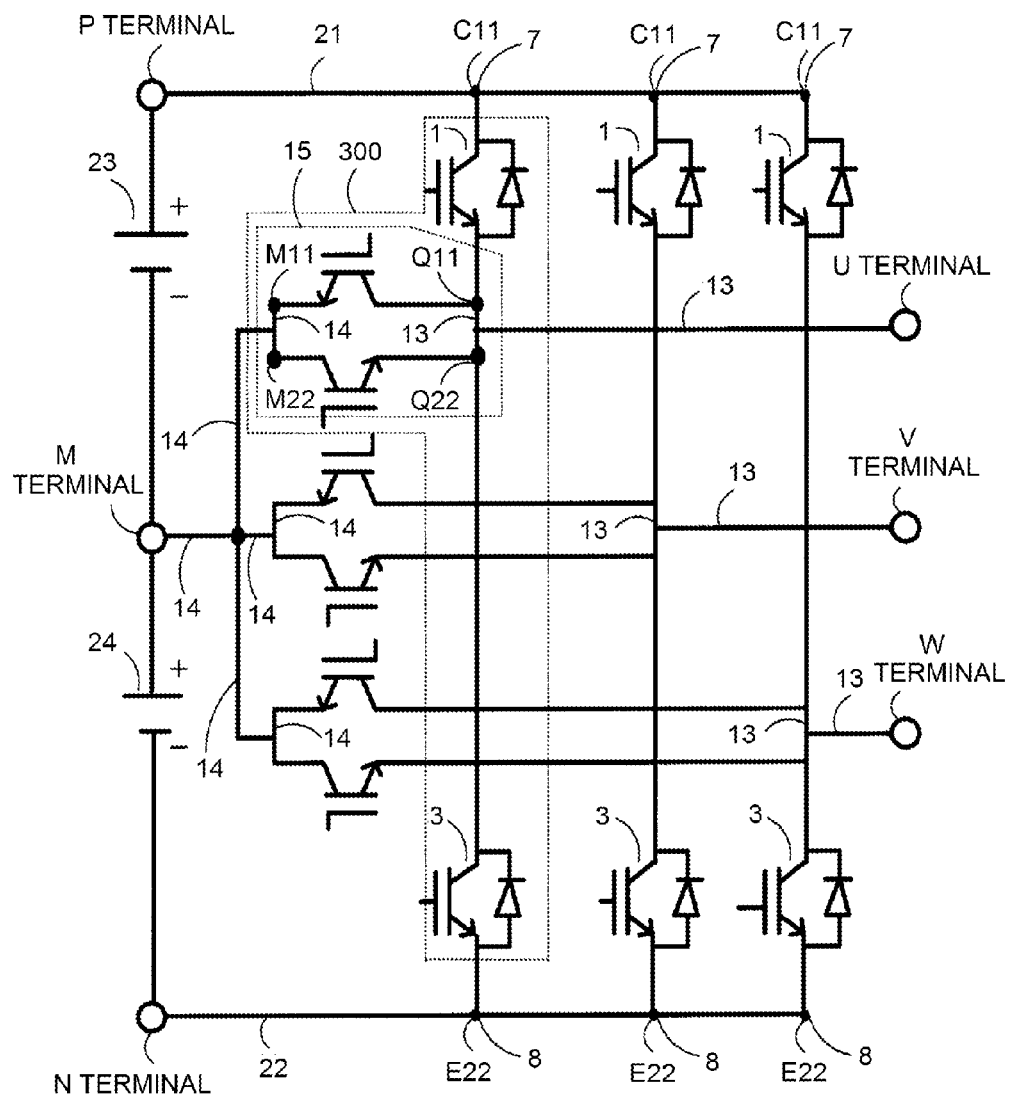
FIG. 9 is a circuit diagram of principal components of the three-level inverter of a fifth example of the invention.

The first IGBT 1 with the FWD 2 antiparallel-connected is an element in an upper arm of a three-level inverter 500 (see FIG. 9 and FIG. 10), and the first reverse blocking IGBT 5 is an element in a portion of an AC switch 15 (see FIG. 9).

Figure 17A:
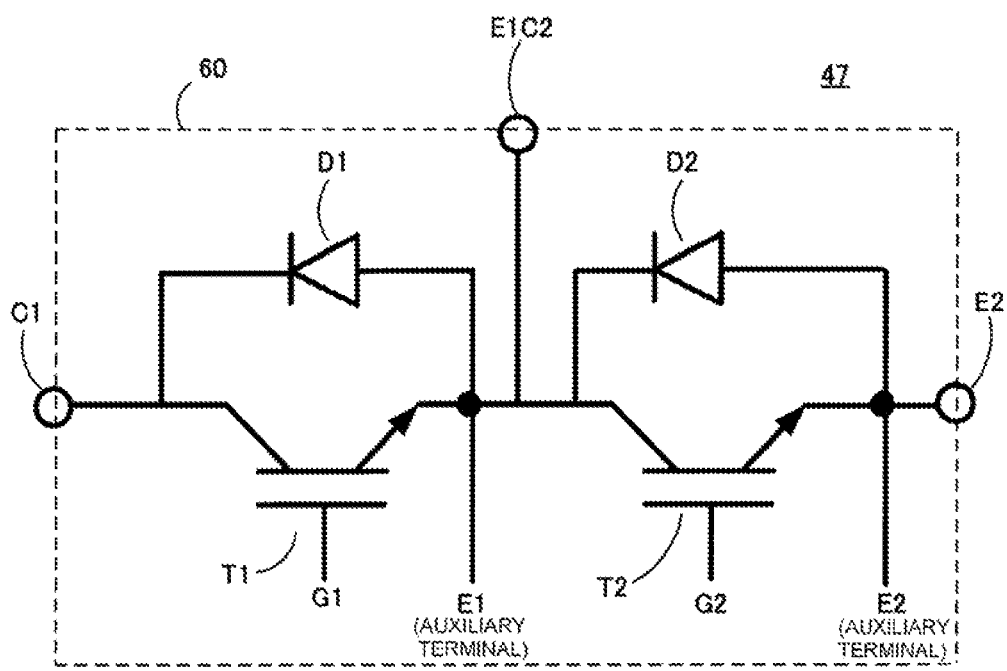
FIG. 17(a) is a circuit diagram.
Figure 17B:
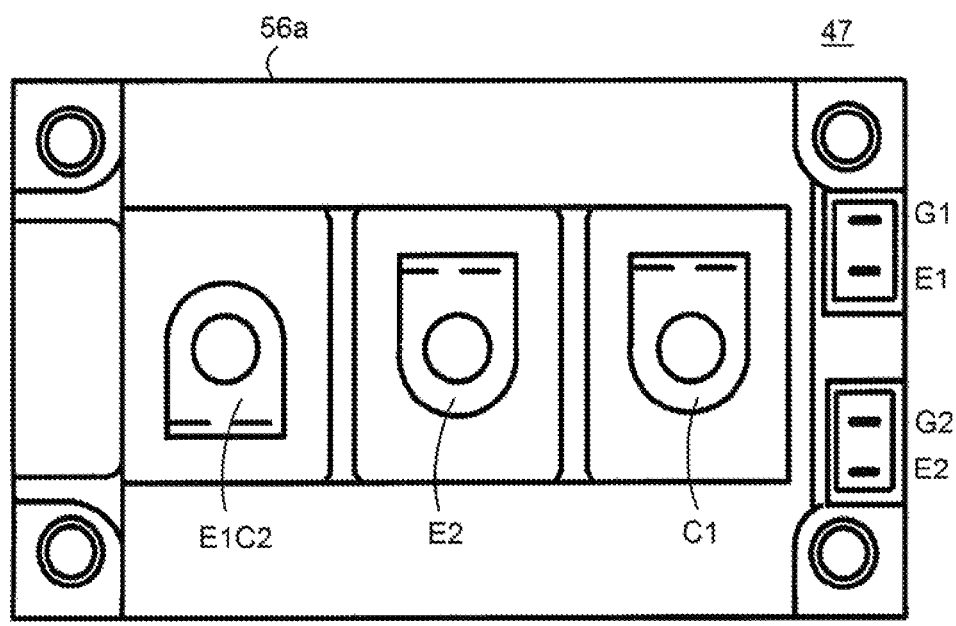
FIG. 17(b) is a plane view of principal components of the semiconductor module.
Figure 18:
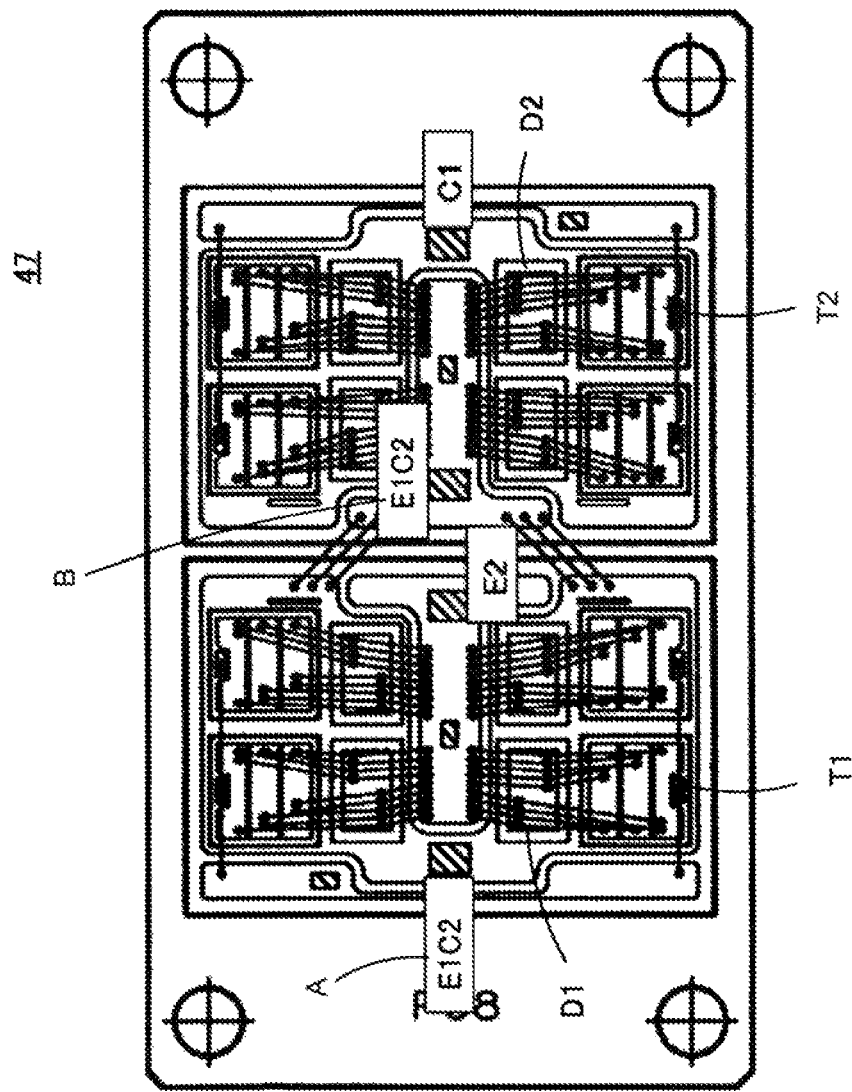
FIG. 18 is a diagram of the inner structure of the semiconductor module of FIG. 17.
Figure 19A:
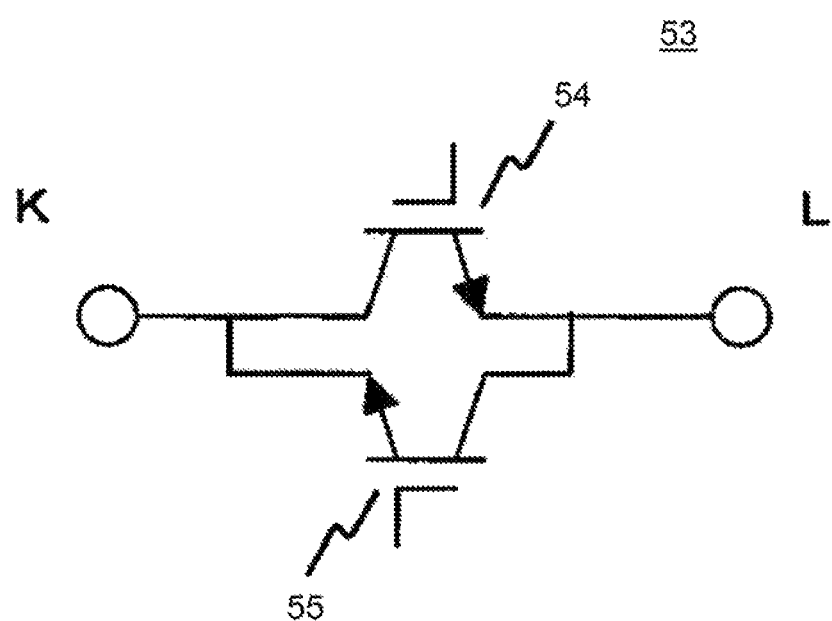
FIG. 19(a) is a circuit diagram.
Figure 19B:
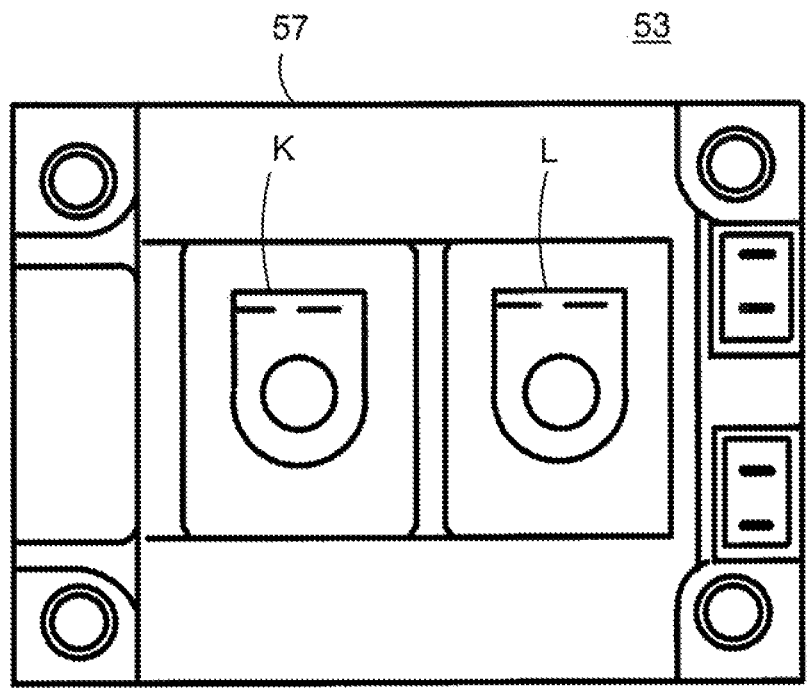
FIG. 19(b) is a plane view of the AC switch package.

The package 56 shown in FIG. 1(*b*) is the same as the package 56*a* of the existing semiconductor module 47 (see FIG. 17(*b*)), including the disposition of each of the terminals.

Thus the package 56 used in the semiconductor module 100 of FIG. 1 can be used in common with the existing package 56*a* of the semiconductor module 47 of the prior art shown in FIG. 17(*b*), so that there is no need to develop a new package for the three-level inverter 500, and consequently the development period for the first semiconductor module 100 can be shortened and costs can be reduced.

Further, a first semiconductor module 100 can be provided which easily supports broad ranges of current ratings and voltage ratings, without developing a new package.

EXAMPLE 2

Figure 3A:
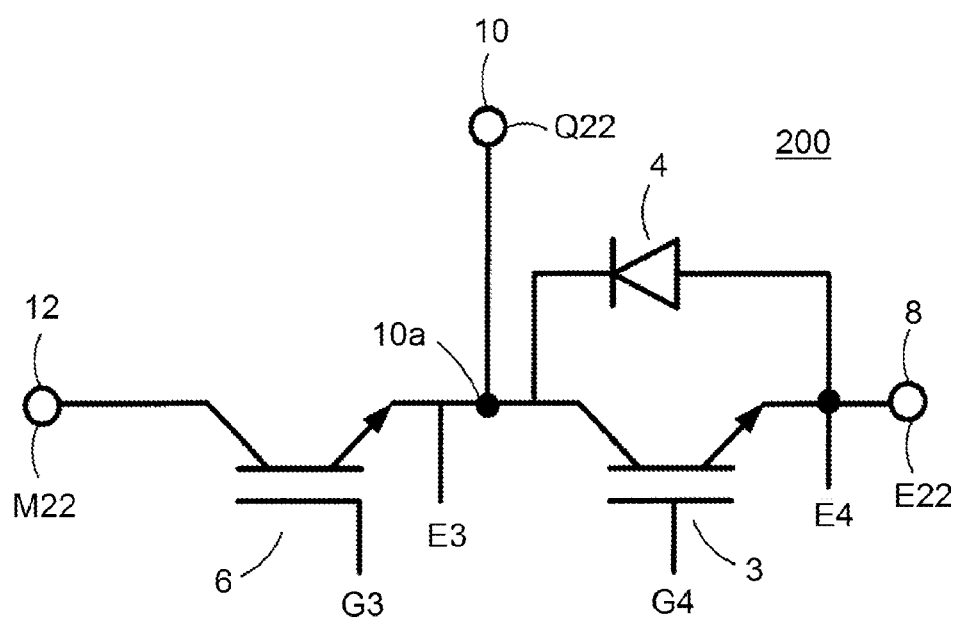
FIG. 3(a) is a circuit diagram of principal components and FIG. 3(b) is a plane view of principal components.
Figure 3B:
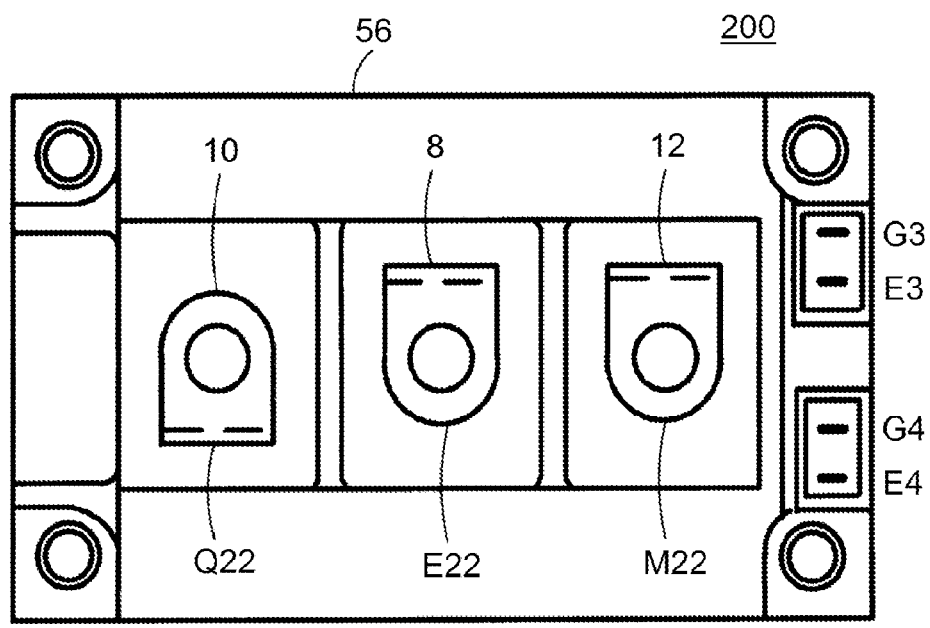
Figure 4:
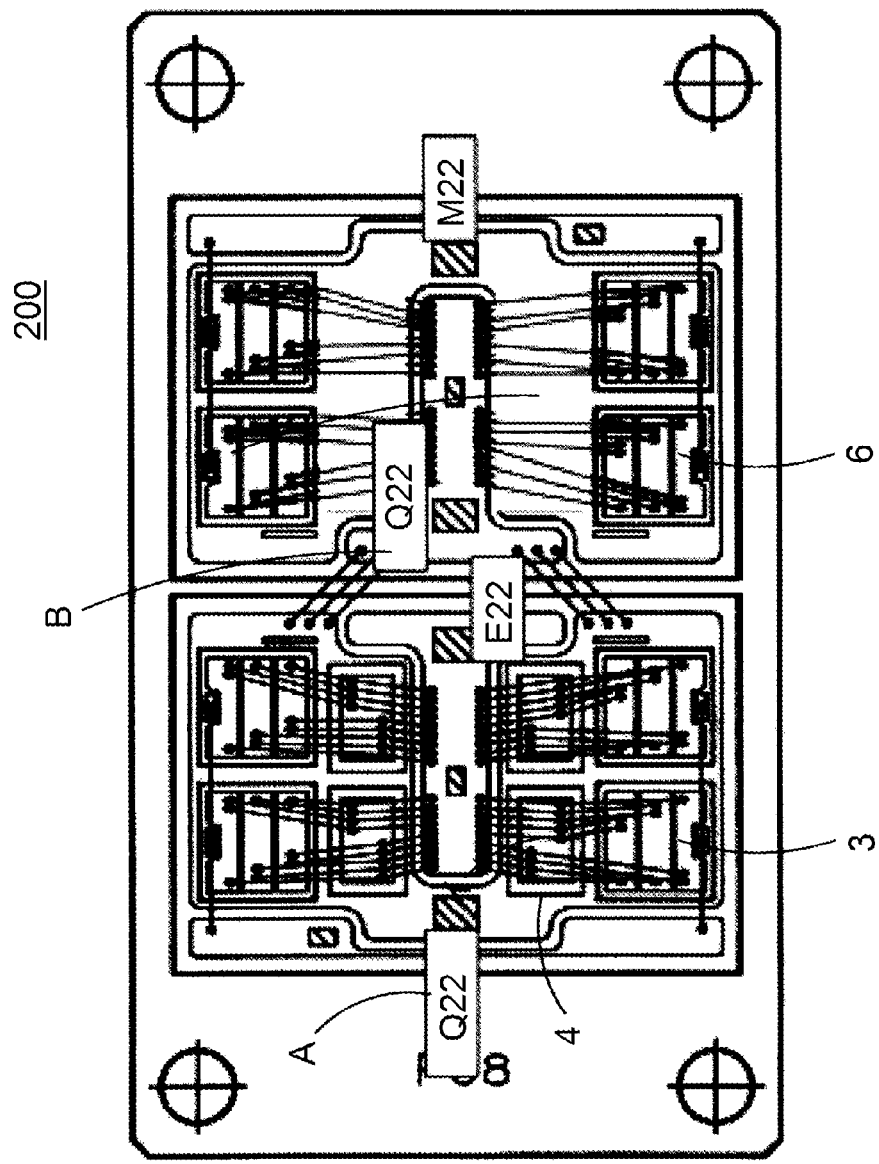
FIG. 4 is a diagram of the internal configuration of the semiconductor module of FIG. 3.

FIG. 3 is a diagram of the configuration of the semiconductor module of a second example of the invention, in which FIG. 3(*a*) is a circuit diagram of principal components and FIG. 3(*b*) is a plane view of principal components. FIG. 4 is a diagram of the internal configuration of the semiconductor module of FIG. 3. FIG. 4 shows an example in which four second reverse blocking IGBTs 6 having a reverse breakdown voltage are parallel-connected, four second IGBTs 3 not having a reverse breakdown voltage (normally used IGBTs) are parallel-connected, and four FWDs 4 are disposed antiparallel to each of the normal second IGBTs 3. This disposition is the same as that in FIG. 18 in which the FWD (D1) is removed. The Q22 terminals a and b are connected within the package 56, with the Q22 terminal a disposed on the package 56, as a terminal corresponding to E1C2 in FIG. 17.

A feature of this second semiconductor module 200 is that the second IGBT 3 not having a reverse breakdown voltage and antiparallel-connected to the FWD 4 of the lower arm of a series-connected circuit of the three-level inverter, and the second reverse blocking IGBT 6 having a reverse breakdown voltage of the AC switch, are accommodated in the same package 56 as an existing package 56*a*.

In the configuration of FIG. 3, the second semiconductor module 200 is configured with the second IGBT 3, with an antiparallel-connected FWD 4, series-connected to the second reverse blocking IGBT 6, and with the collector of the second IGBT 3 connected to the emitter of the second reverse blocking IGBT 6.

The low-potential side terminal 8 (E22) connected to the emitter of the second IGBT 3, the second intermediate potential auxiliary terminal 12 (M22) connected to the collector of the second reverse blocking IGBT 6, the second connection terminal 10 (Q22) connected to the connection point 10*a* of the collector of the second IGBT 3 and the emitter of the second reverse blocking IGBT 6, and the respective gate terminals G2 and auxiliary emitter terminals E2 of the second IGBT 3 and the second reverse blocking IGBT 6, are disposed on the package 56 of the second semiconductor module 200.

Further, on the package 56 are disposed the gate terminals G3 and G4 and the auxiliary emitter terminals E3 and E4 respectively of the second IGBT 3 and the second reverse blocking IGBT 6. Q22 is a terminal corresponding to E1C2 in FIG. 17.

The second IGBT 3 with the FWD 4 antiparallel-connected is an element in a lower arm of a three-level inverter 500, and the second reverse blocking IGBT 6 is an element in a portion of an AC switch 15 (see FIG. 9).

The package 56 shown in FIG. 3(*b*) is the same as the package 56*a* of the existing semiconductor module 47 (see FIG. 17) accommodating two series-connected IGBT chips of the prior art, including the disposition of each of the terminals.

Thus the package 56 used in the semiconductor module 200 of FIG. 3(*b*) can be used in common with the existing package 56*a* of the semiconductor module 47 of the prior art shown in FIG. 17(*b*), so that there is no need to develop a new package for the three-level inverter 500, and consequently the development period for the second semiconductor module 200 can be shortened and costs can be reduced.

Further, a second semiconductor module 200 can be provided which easily supports broad ranges of current ratings and voltage ratings, without developing a new package.

In the drawings, G3 and E3 are the gate terminal and emitter auxiliary terminal of the second reverse blocking IGBT 6, and G4 and E4 are the gate terminal and emitter auxiliary terminal of the second IGBT 3.

EXAMPLE 3

Figure 5:
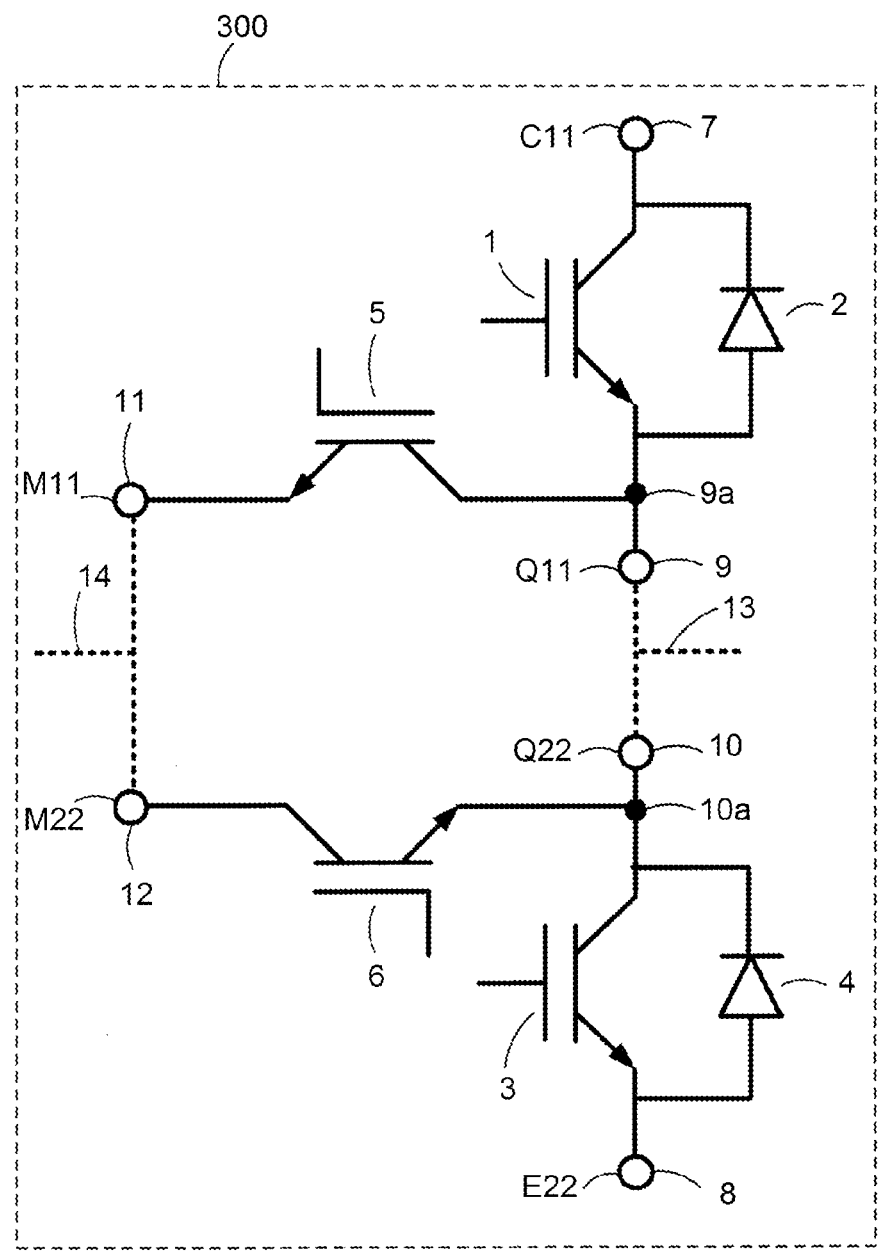
FIG. 5 is a circuit diagram of principal components of the upper and lower arm kit of a third example of the invention.
Figure 6:
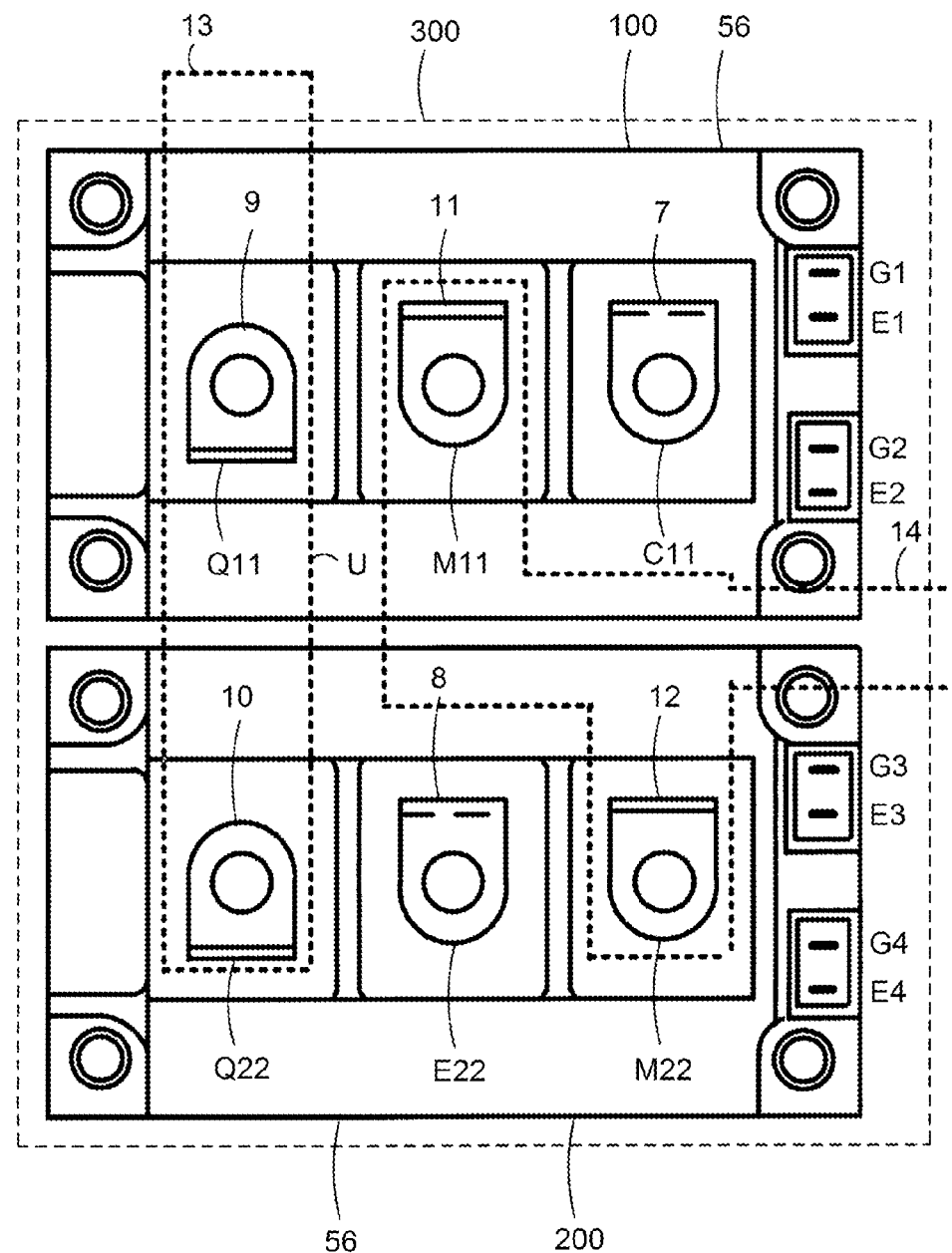
FIG. 6 is a plane view of principal components of the upper and lower arm kit of the third example of the invention.

FIG. 5 and FIG. 6 show the upper and lower arm kit of a third example of the invention. FIG. 5 is a circuit diagram of principal components, and FIG. 6 is a plane view of principal components.

Figure 10:
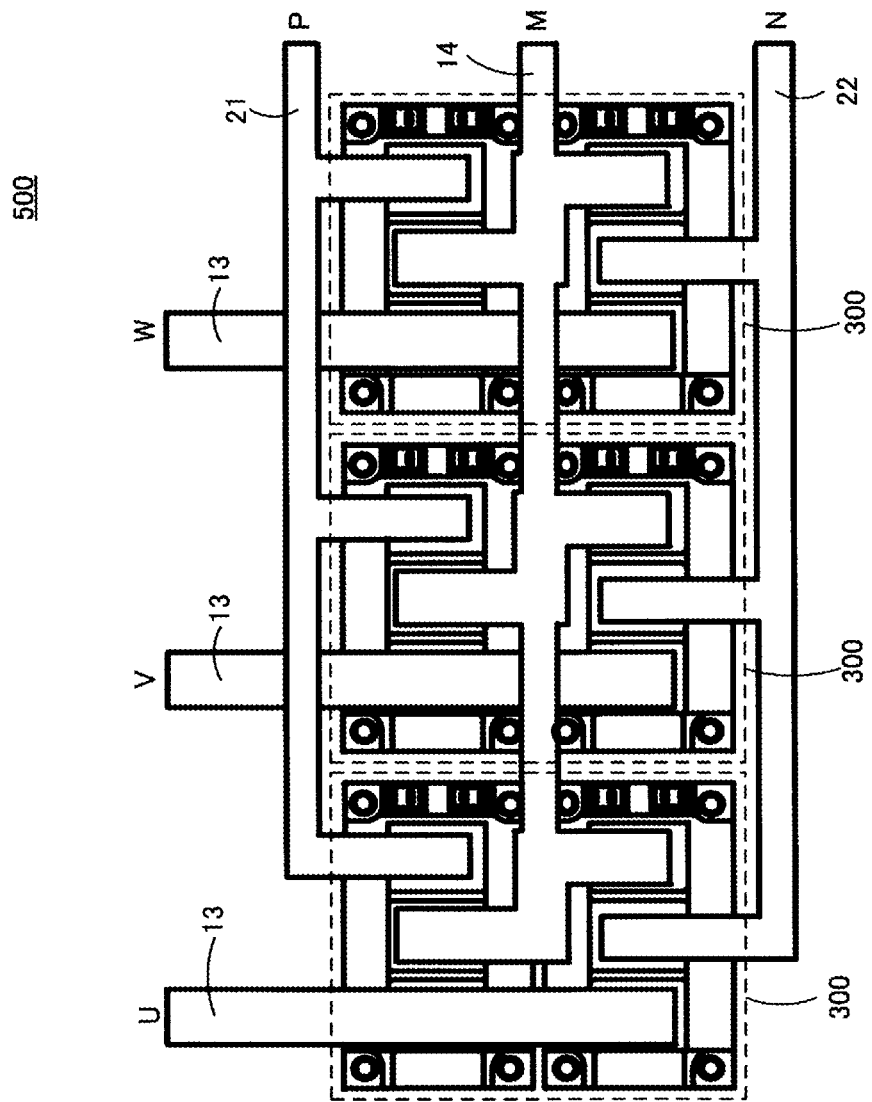
FIG. 10 is a plane view of principal components in a configuration diagram of the three-level inverter of the fifth example of the invention.

This upper and lower arm kit 300 is formed of the pair of the first semiconductor module 100 to be the upper arm, and the second semiconductor module 200 to be the lower arm, of the three-level inverter 500 shown in FIG. 9 and FIG. 10.

A method for configuring one upper and lower arm of a three-level inverter 500 using the upper and lower arm kit 300 of FIG. 5 and FIG. 6, in which the upper and lower arms are not connected, is explained.

The first connection terminal 9 (Q11) of the first semiconductor module 100 and the second connection terminal 10 (Q22) of the second semiconductor module 200 are connected by a first connection conductor 13, indicated by a dashed line, and taken to be an output terminal, for example the U terminal, of the three-level inverter 500 (see FIG. 9 and FIG. 10).

The first intermediate potential auxiliary terminal 11 (M11) of the first semiconductor module 100 and the second intermediate potential auxiliary terminal 12 (M22) of the second semiconductor module 200 are connected by a second connection conductor 14, indicated by a dashed line, and taken to be an intermediate potential terminal, which is the M terminal, of the three-level inverter 500.

The high-potential side terminal 7 (C11) of the first semiconductor module 100 is connected to a P terminal, not shown, of the three-level inverter 500, and the low-potential side terminal 8 (E22) of the second semiconductor module 200 is connected to an N terminal, not shown, of the three-level inverter 500.

Thus using the same package 56 as the existing package 56a, the upper and lower arm kit 300 can be configured, and so the cost of the upper and lower arm kit 300 can be reduced. Further, an upper and lower arm kit 300 can be provided which can easily support broad ranges of current ratings and voltage ratings.

Further, the upper and lower arm kit 300 is configured using the first semiconductor module 100 and second semiconductor module 200 which are not connected together.

EXAMPLE 4

Figure 7:
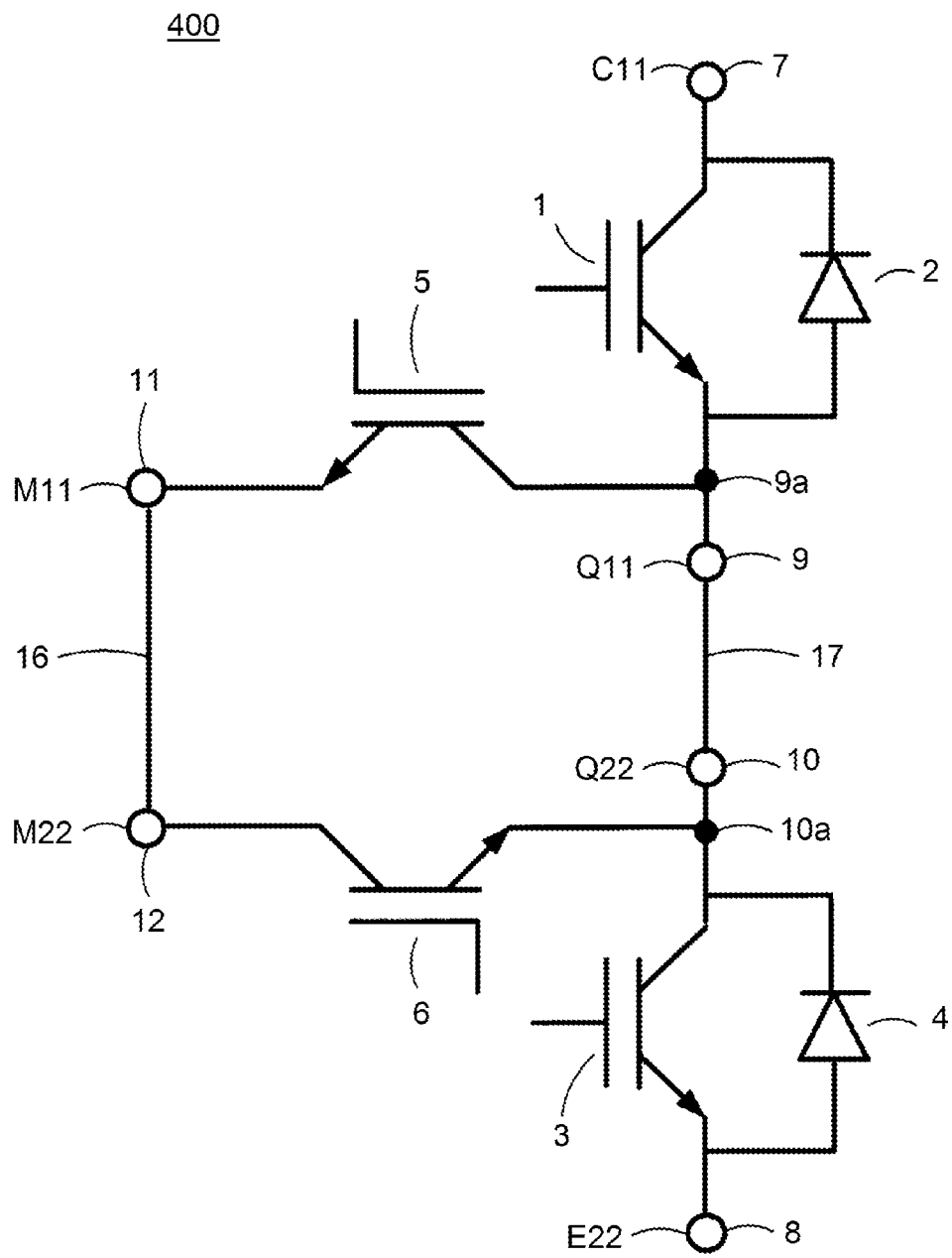
FIG. 7 is a circuit diagram of principal components of the upper and lower arm kit of a fourth example of the invention.
Figure 8:
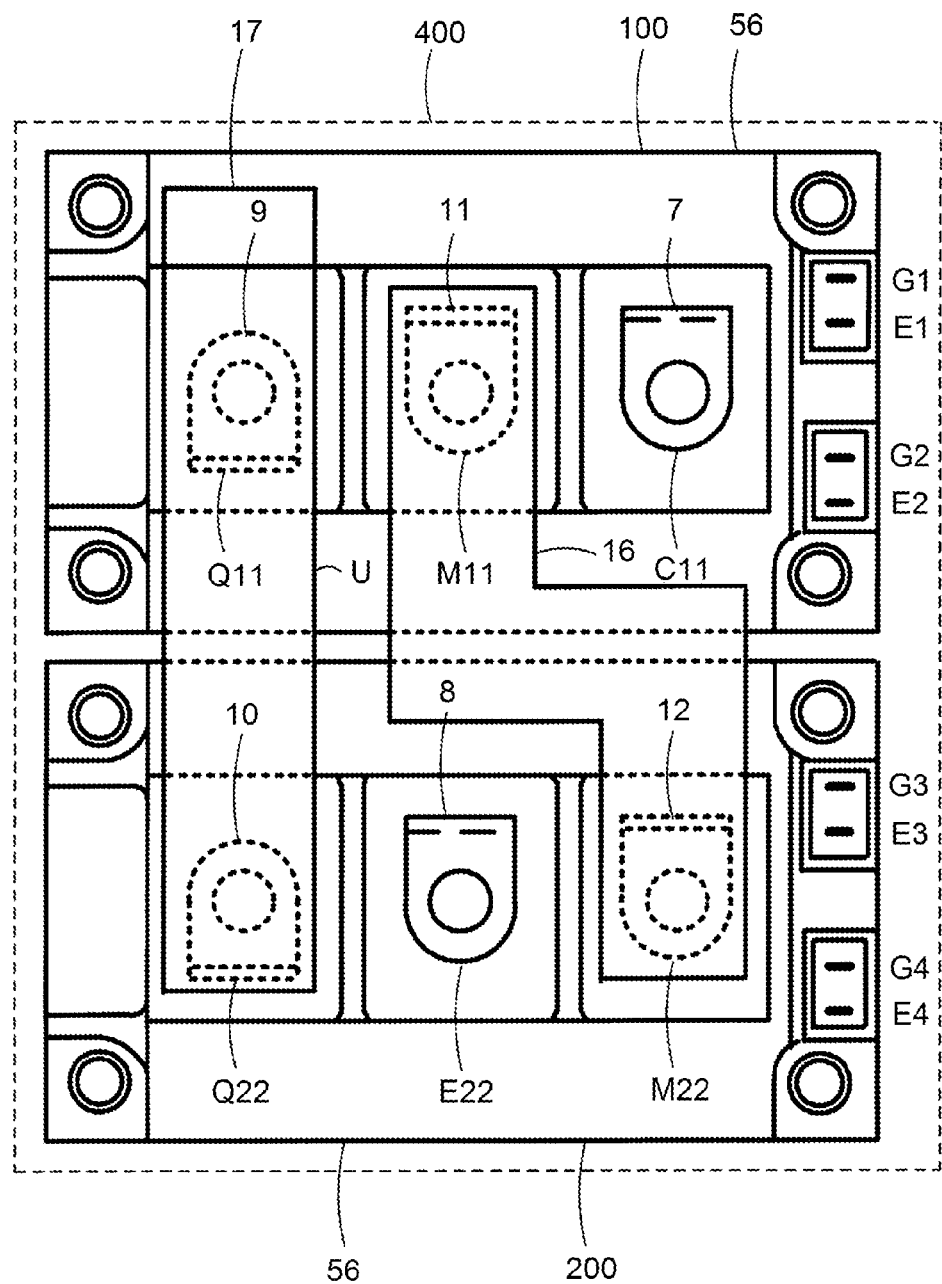
FIG. 8 is a plane view of principal components of the upper and lower arm kit of the fourth example of the invention.

FIG. 7 and FIG. 8 show the upper and lower arm kit of a fourth example of the invention, in which FIG. 7 is a circuit diagram of principal components and FIG. 8 is a plane view of principal components.

A difference between the upper and lower arm kit 400 of FIG. 7 and FIG. 8 and the upper and lower arm kit 300 of FIG. 5 and FIG. 6 is that Q1 and M11 of the first semiconductor module 100 on the upper arm side and Q22 and M22 of the second semiconductor module 200 on the lower arm side are connected by a third connection conductor 16 and fourth connection conductor 17, integrating the upper and lower arm semiconductor modules 100 and 200.

In this case the upper and lower arms are integrated, so that use is facilitated. Advantageous effects similar to those of the third example are obtained.

EXAMPLE 5

FIG. 9 and FIG. 10 show the configuration of the three-level inverter of a fifth example of the invention, in which FIG. 9 is a circuit diagram of principal components and FIG. 10 is a plane view of principal components. In FIG. 10, the first and second DC power supplies 23 and 24 of FIG. 9 are not shown.

The terminals Q11 and Q22 of each of the three upper and lower arm kits 300 (FIG. 5 and FIG. 6) are connected by first connection conductors 13 to serve as the output terminals which are the U terminal, the V terminal, and the W terminal.

Further, the terminals M11 and M22 of each of the three upper and lower arm kits 300 are connected by second connection conductors 14, to serve as the intermediate potential terminal which is the M terminal. This portion forms the AC switches 15 of the three-level inverter 500 shown in FIG. 9.

The high-potential side terminals 7 (C11) of the first semiconductor modules 100 are connected together by the fifth connection conductor 21 to serve as the P terminal of the three-level inverter 500.

Further, the low-potential side terminals 8 (E22) of the second semiconductor modules 200 are connected together by the sixth connection conductor 22 to serve as the N terminal of the three-level inverter 500.

The positive electrode and negative electrode of the first DC power supply 23 are connected to the P terminal and the M terminal respectively of the three-level inverter 500, and the positive electrode and negative electrode of the second DC power supply 24 are connected to the M terminal and the N terminal respectively of the three-level inverter 500, to configure the three-level inverter 500. Although not shown, there are also cases in which, by providing intermediate potential terminals which are M terminals in two places, the wiring inductance connecting the first and second DC power supplies 23 and 24 can be reduced.

Thus using three upper and lower arm kits 300, each comprising a first semiconductor module 100 configuring the upper-arm side and a second semiconductor module 200 configuring the lower-arm side, the three-level inverter 500 is fabricated, so that the cost of the three-level inverter 500 can be reduced. Further, a three-level inverter 500 can be fabricated which can easily support broad ranges of current ratings and voltage ratings.

EXAMPLE 6

Figure 11:
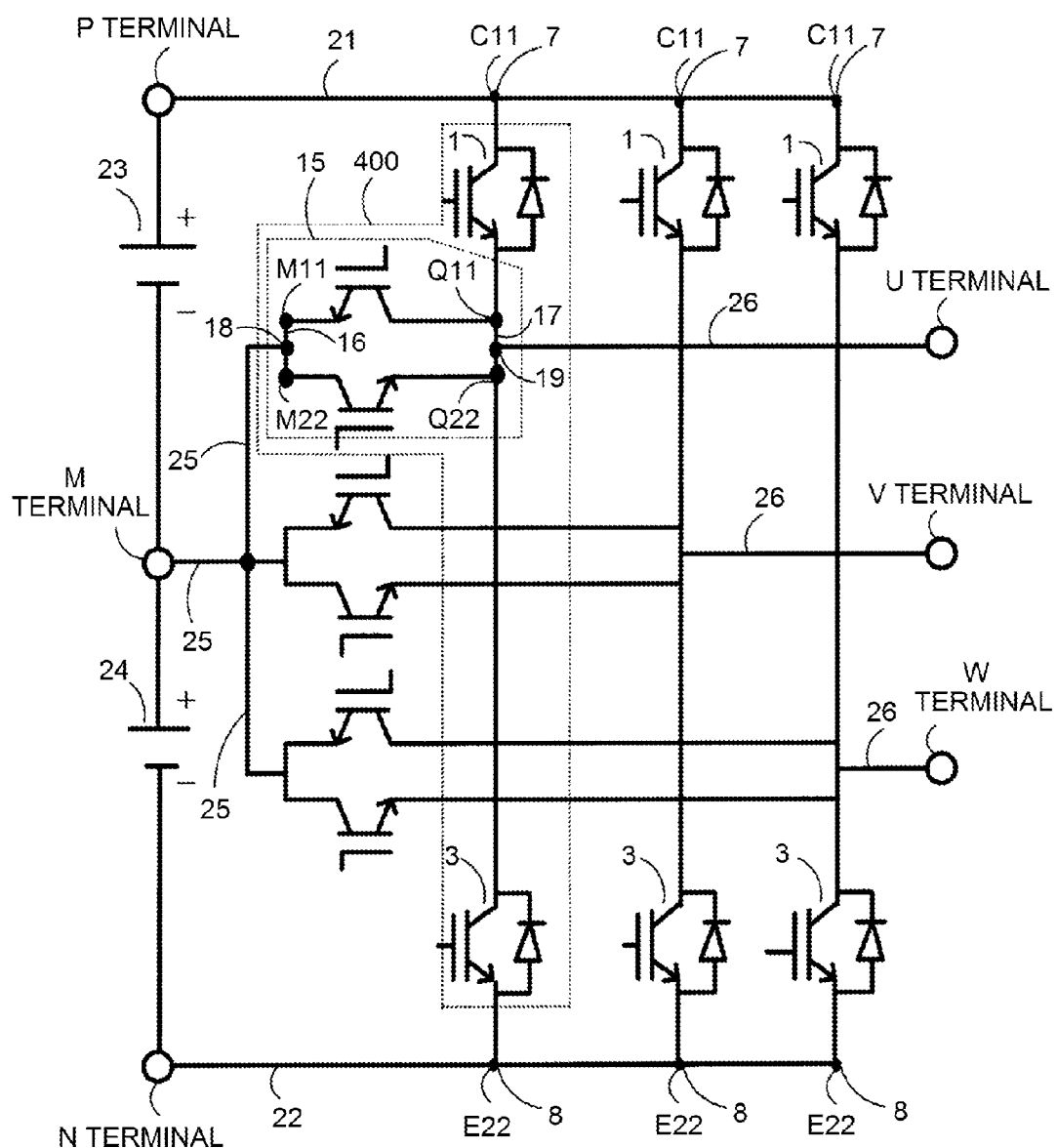
FIG. 11 is a circuit diagram of principal components of the three-level inverter of a sixth example of the invention.
Figure 12:
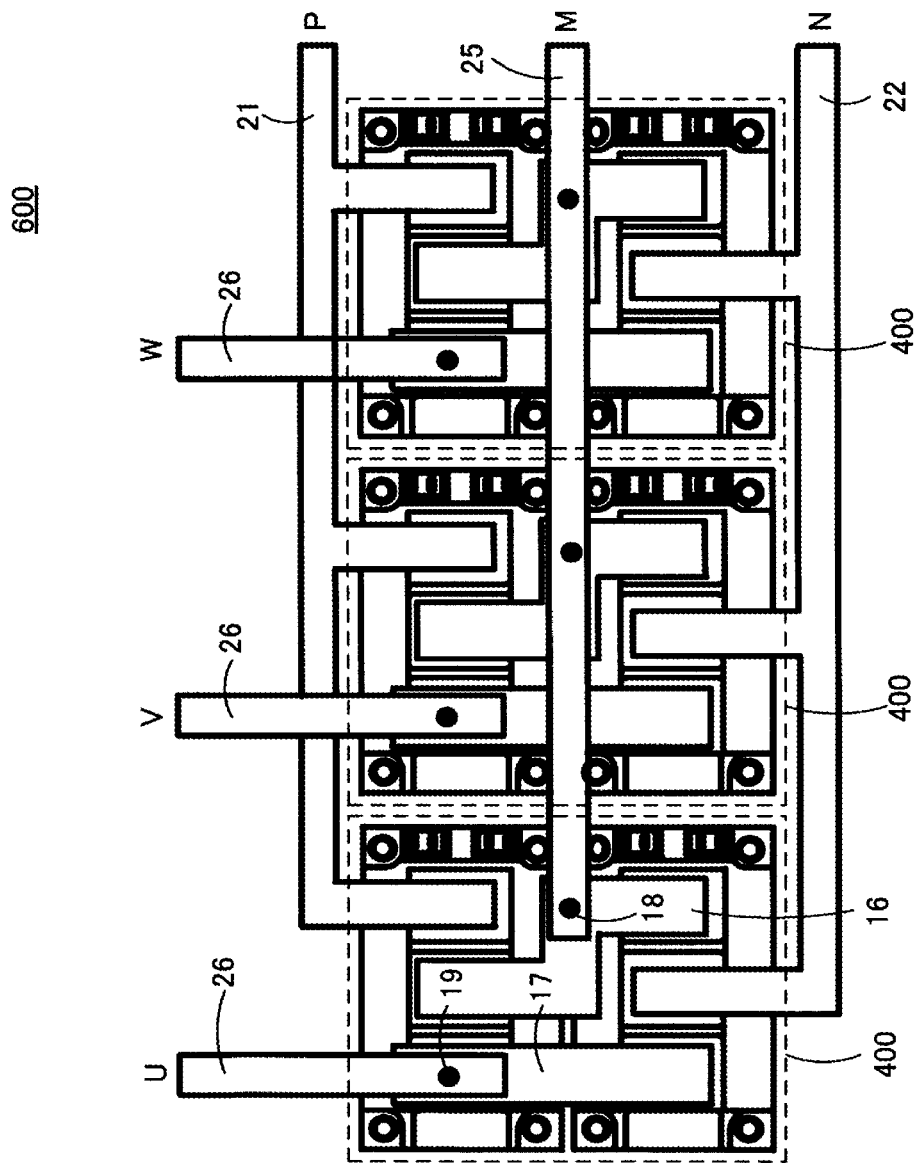
FIG. 12 is a plane view of principal components in a configuration diagram of the three-level inverter of the sixth example of the invention.
Figure 13:
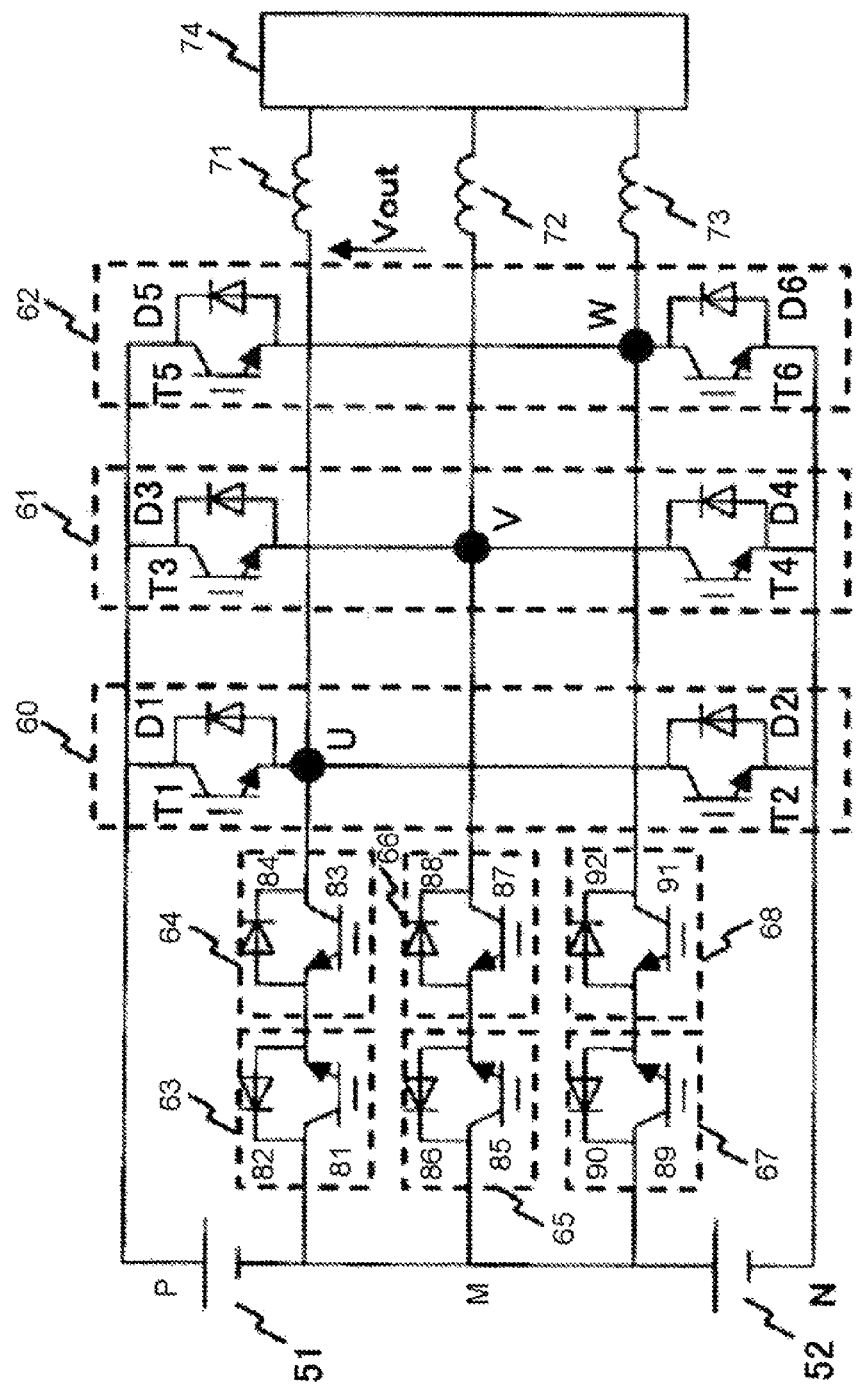
FIG. 13 is a circuit diagram of a three-level inverter of the prior art which converts a direct current into an alternating current.
Figure 14:
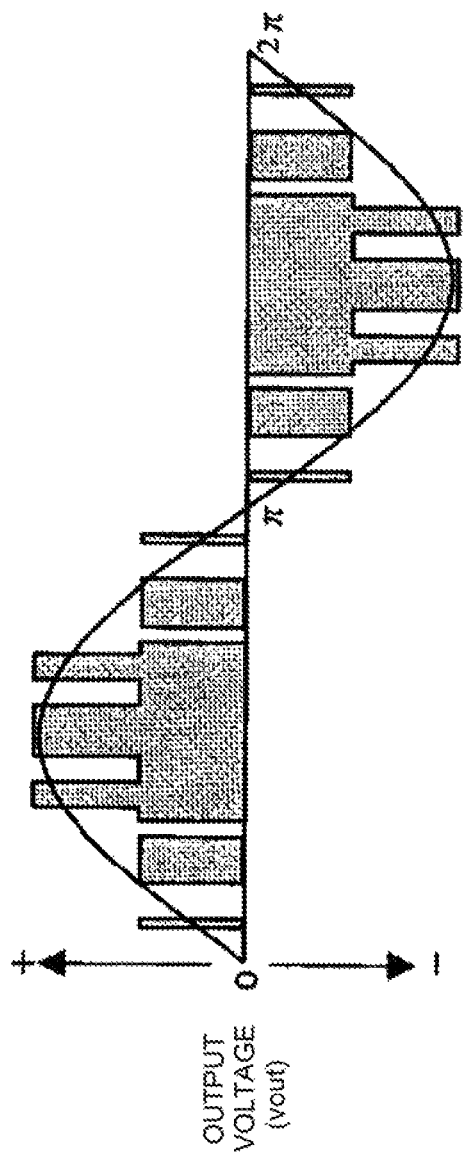
FIG. 14 is a diagram of an output voltage (Vout) waveform example of a three-level inverter.
Figure 15A:
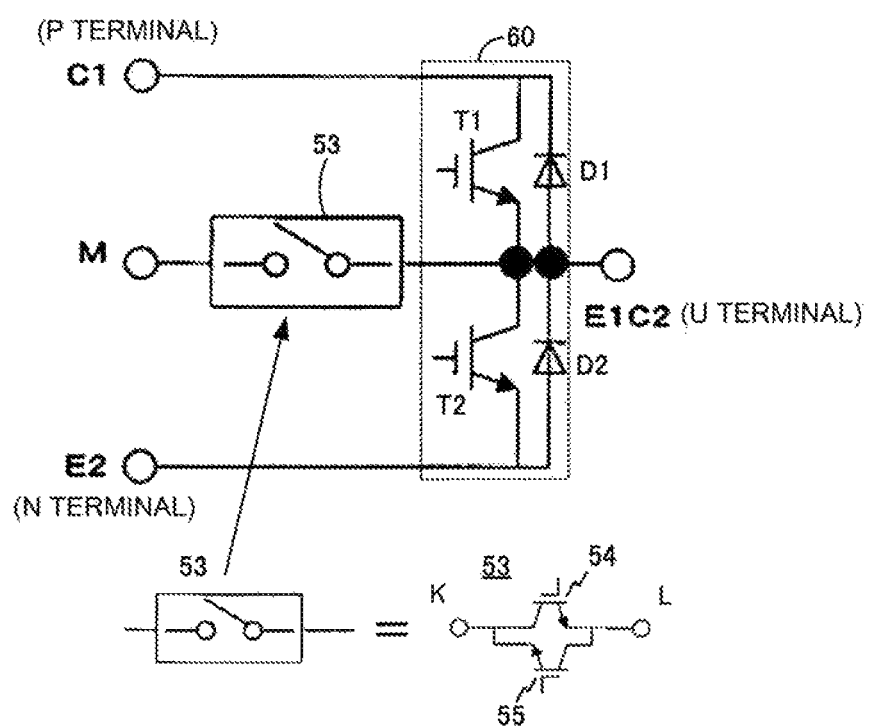
FIG. 15(a) is a circuit diagram and FIG. 15(b) is a perspective view of the semiconductor module.
Figure 15B:
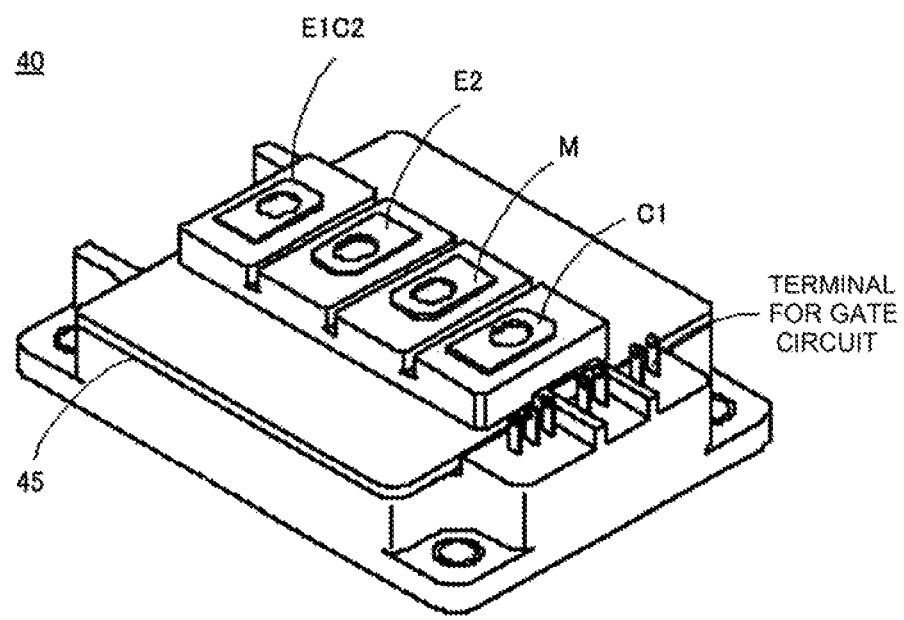
Figure 16:
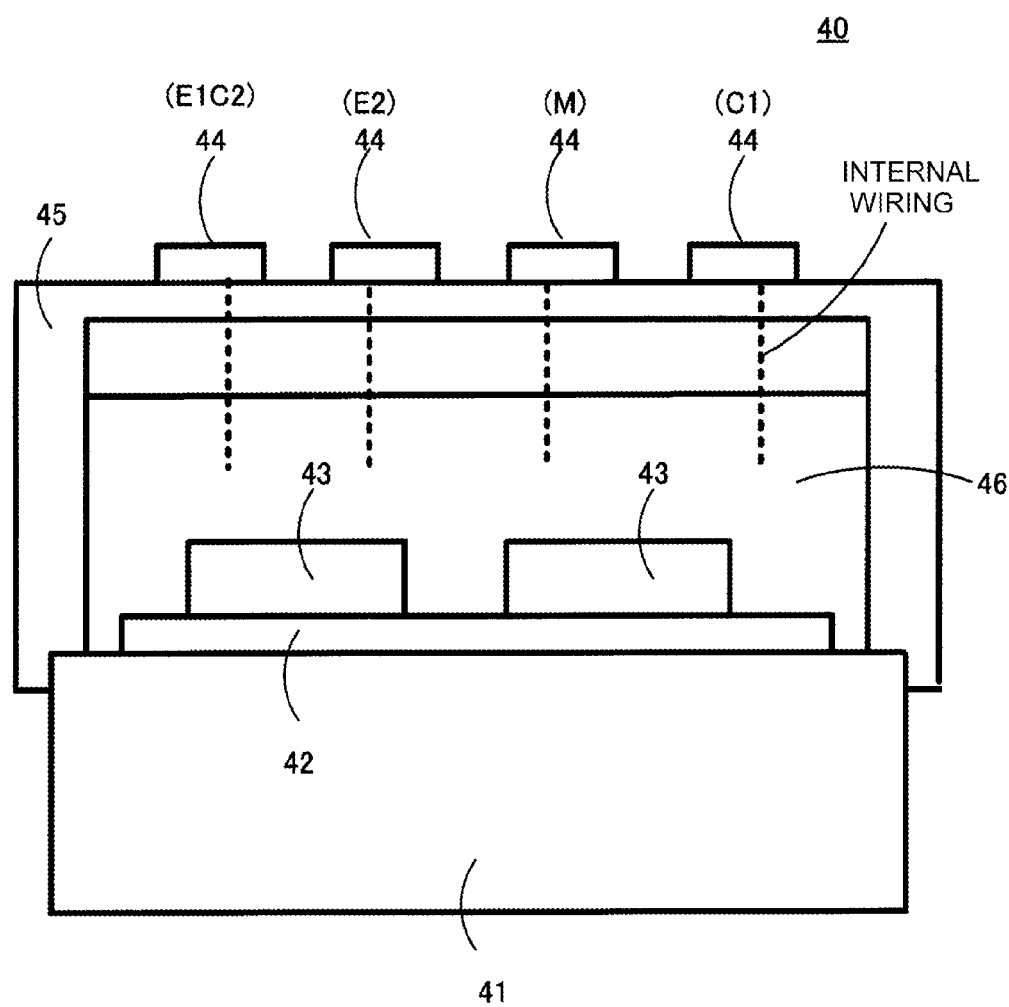
FIG. 16 is a schematic cross-sectional view of a semiconductor module.

FIG. 11 and FIG. 12 show the configuration of the three-level inverter of a sixth example of the invention, in which FIG. 11 is a circuit diagram of principal components and FIG. 12 is a plane view of principal components. In FIG. 12, the first and second DC power supplies 23 and 24 of FIG. 10 are not shown.

A difference between the three-level inverter 600 and the three-level inverter 500 of FIG. 9 and FIG. 10 is the use of the upper and lower arm kits 400 instead of the upper and lower arm kits 300. In an upper and lower arm kit 400, the first semiconductor module 100 and second semiconductor module 200 are connected by third and fourth connection conductors 16 and 17, and thus a seventh connection conductor 25 and eighth connection conductor 26 are connected to the third and fourth connection conductors 16 and 17 at the connection points 18 and 19 respectively, to serve as the M terminal, U terminal, V terminal, and W terminal.

The positive electrode and negative electrode of the first DC power supply 23 are connected to the P terminal and the M terminal respectively of the three-level inverter 600, and the positive electrode and negative electrode of the second DC power supply 24 are connected to the M terminal and the N terminal respectively of the three-level inverter 600, to configure the three-level inverter 600. Although not shown, there are also cases in which, by providing intermediate potential terminals which are M terminals in two places, the wiring inductance connecting the first and second DC power supplies 23 and 24 can be reduced.

In the case of this three-level inverter 600 also, advantageous effects similar to those for the three-level inverter 500 are obtained.

Further, examples were given in the first through sixth examples in which IGBTs were used as the semiconductor elements, but power MOSFETs may also be used. However, in the case of power MOSFETs incorporating FWDs, there is no need for external FWDs. Further, because power MOSFETs do not have a reverse breakdown voltage, diodes connected in series must be used with the power MOSFETs used in places corresponding to reverse blocking IGBTs.

The above briefly describes the principles of the invention.

Numerous modifications and changes can be made by a person skilled in the art, and the invention is not limited to the above-described precise configurations and application examples, and all corresponding modifications and equivalents are to be regarded as included in the scope of the invention as described in the attached claims and equivalents thereof.

EXPLANATION OF REFERENCE NUMERALS

1 First IGBT
2, 4 FWD

3 Second IGBT
5 First reverse blocking IGBT
6 Second reverse blocking IGBT
7 High-potential side terminal (C11)
8 Low-potential side terminal (E22)
9 First connection terminal (Q11)
9a, 10a, 18, 19 Connection point
10 Second connection terminal (Q22)
11 First intermediate potential auxiliary terminal (M11)
12 Second intermediate potential auxiliary terminal (M22)
13 First connection conductor (output terminal: U terminal, V terminal, N terminal)
14 Second connection conductor (intermediate potential terminal: M terminal)
15 AC switch
16 Third connection conductor
17 Fourth connection conductor
21 Fifth connection conductor (P terminal)
22 Sixth connection conductor (N terminal)
23 First DC power supply
24 Second DC power supply
25 Seventh connection conductor (intermediate potential terminal: M terminal)
26 Eighth connection conductor (output terminal: U terminal, V terminal, W terminal)
56 Package (same as the existing package 56a)
100 First semiconductor module
200 Second semiconductor module
300, 400 Upper and lower arm kit
500, 600 Three-level inverter

The invention claimed is:

1. An upper and lower arm kit, comprising a first semiconductor module for an upper arm and a second semiconductor module for a lower arm in a three-level inverter,
wherein the first semiconductor module includes:
a first asymmetrical switching element having a first reverse breakdown voltage, and antiparallel-connected to a freewheeling diode;
a first reverse blocking switching element having a second reverse breakdown voltage that is greater in magnitude than the first reverse breakdown voltage of the first asymmetrical switching element, and series-connected to the first asymmetrical switching element;
a first package, in which the first asymmetrical switching element and the first reverse blocking switching element are accommodated;
a high-potential side terminal (C11), disposed on an upper face of the first package and connected to a high-potential side of the first asymmetrical switching element;
a first intermediate potential auxiliary terminal (M11), disposed on the upper face of the first package and connected to a low-potential side of the first reverse blocking switching element; and
a first connection terminal (Q11), disposed on the upper face of the first package and connected to the first asymmetrical switching element and to the first reverse blocking switching element, and
wherein the second semiconductor module includes:
a second reverse blocking switching element having a second reverse breakdown voltage;
a second asymmetrical switching element having a reverse breakdown voltage that is smaller in magnitude than the second reverse breakdown voltage of the second reverse blocking switching element, series-connected to the second reverse blocking switching element and antiparallel-connected to a freewheeling diode;
a second package, in which the second reverse blocking switching element and the second asymmetrical switching element are accommodated;
a second intermediate potential auxiliary terminal (M22), disposed on an upper face of the second package and connected to a high-potential side of the second reverse blocking switching element;
a low-potential side terminal (E22), disposed on the upper face of the second package and connected to a low-potential side of the second asymmetrical switching element; and
a second connection terminal (Q22), disposed on the upper face of the second package, and connected to the second reverse blocking switching element and to the second asymmetrical switching element, and
wherein the first connection terminal (Q11 terminal) and second connection terminal (Q22 terminal) are connected by a sixth connection conductor, and the intermediate potential auxiliary terminal (M11 terminal) of the first semiconductor module and the intermediate potential auxiliary terminal (M22 terminal) of the second semiconductor module are connected by a fifth connection conductor, and
wherein the first semiconductor module and the second semiconductor module are not integrally formed.

2. A three-level inverter,
wherein three of the upper and lower arm kits as in claim 1 are disposed in parallel, and
wherein the high-potential side terminals (C11 terminals) of the first semiconductor modules are connected together by a third connection conductor, the low-potential side terminals (E22 terminals) of the second semiconductor modules are connected together by a fourth connection conductor, the intermediate potential auxiliary terminal (M11) of each of the first semiconductor modules and the intermediate potential auxiliary terminal (M22) of each of the second semiconductor modules are connected together by a fifth connection conductor, the third connection conductor and the fifth connection conductor are respectively connected to a positive terminal and a negative terminal of a first DC power supply, the fifth connection conductor and the fourth connection conductor are respectively connected to a positive terminal and a negative terminal of a second DC power supply, the first connection terminal (Q11) of each of the first semiconductor modules and the second connection terminal (Q22) of each of the second semiconductor modules are connected together by a sixth connection conductor, and the three sixth connection conductors are taken to be output terminals, which are a U terminal, a V terminal, and a W terminal.

3. An upper and lower arm kit, comprising a first semiconductor module and a second semiconductor module,
wherein the first semiconductor module includes:
a first asymmetrical switching element having a first reverse breakdown voltage, and antiparallel-connected to a freewheeling diode;
a first reverse blocking switching element having a second reverse breakdown voltage that is greater in magnitude than the first reverse breakdown voltage of the first asymmetrical switching element, and series-connected to the first asymmetrical switching element;

a first package, in which the first asymmetrical switching element and the first reverse blocking switching element are accommodated;

a high-potential side terminal (C11), disposed on an upper face of the first package and connected to a high-potential side of the first asymmetrical switching element;

a first intermediate potential auxiliary terminal (M11), disposed on the upper face of the first package and connected to a low-potential side of the first reverse blocking switching element; and a first connection terminal (Q11), disposed on the upper face of the first package and connected to the first asymmetrical switching element and to the first reverse blocking switching element, and wherein the second semiconductor module includes:

a second reverse blocking switching element having a second reverse breakdown voltage;

a second asymmetrical switching element having a second reverse breakdown voltage that is smaller in magnitude than the second reverse breakdown voltage of the second reverse blocking switching element, series-connected to the second reverse blocking switching element and antiparallel-connected to a freewheeling diode;

a second package, in which the second reverse blocking switching element and the second asymmetrical switching element are accommodated;

a second intermediate potential auxiliary terminal (M22), disposed on an upper face of the second package and connected to a high-potential side of the second reverse blocking switching element;

a low-potential side terminal (E22), disposed on the upper face of the second package and connected to a low-potential side of the second asymmetrical switching element; and a second connection terminal (Q22), disposed on the upper face of the second package, and connected to the second reverse blocking switching element and to the second asymmetrical switching element, and wherein the first connection terminal (Q11 terminal) and second connection terminal (Q22 terminal) are connected by a first connection conductor, and the intermediate potential auxiliary terminal (M11 terminal) of the first semiconductor module and the intermediate potential auxiliary terminal (M22 terminal) of the second semiconductor module are connected by a second connection conductor.

4. A three-level inverter, wherein three of the upper and lower arm kits as in claim 3 are disposed in parallel, and wherein output terminals of the three-level inverter, which are a U terminal, a V terminal, and a W terminal, are connected to the three first connection conductors, respectively, the second connection conductors are connected together as an intermediate potential terminal (M terminal), the high-potential side terminals of the first semiconductor modules are connected together and to a positive terminal of a first DC power supply via a third connection conductor, a negative terminal of the first DC power supply is connected to the intermediate potential terminal (M terminal), the low-potential side terminals of the second semiconductor modules are connected together and to a negative terminal of a second DC power supply via a fourth connection conductor, and a positive terminal of the second DC power supply is connected to the intermediate potential terminal (M terminal).

* * * * *